US009564313B2

(12) United States Patent
Akae et al.

(10) Patent No.: US 9,564,313 B2
(45) Date of Patent: Feb. 7, 2017

(54) METHOD OF MANUFACTURING SEMICONDUCTOR DEVICE, INCLUDING FILM HAVING UNIFORM THICKNESS

(71) Applicant: Hitachi Kokusai Electric Inc., Tokyo (JP)

(72) Inventors: Naonori Akae, Toyama (JP); Tatsuya Yotsutani, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 21 days.

(21) Appl. No.: 14/601,634

(22) Filed: Jan. 21, 2015

(65) Prior Publication Data
US 2015/0206736 A1    Jul. 23, 2015

(30) Foreign Application Priority Data

Jan. 23, 2014   (JP) ................ 2014-010556

(51) Int. Cl.
| | |
|---|---|
| C23C 16/455 | (2006.01) |
| H01L 21/02 | (2006.01) |
| C23C 16/30 | (2006.01) |
| C23C 16/34 | (2006.01) |
| C23C 16/36 | (2006.01) |
| C23C 16/44 | (2006.01) |
| C23C 16/507 | (2006.01) |

(52) U.S. Cl.
CPC ........... *H01L 21/0228* (2013.01); *C23C 16/30* (2013.01); *C23C 16/308* (2013.01); *C23C 16/345* (2013.01);
(Continued)

(58) Field of Classification Search
CPC ..................... C23C 16/45523; C23C 16/45525
See application file for complete search history.

(56) References Cited

U.S. PATENT DOCUMENTS

| | | | |
|---|---|---|---|
| 2004/0007186 A1 | 1/2004 | Saito | |
| 2010/0132614 A1* | 6/2010 | Kato | ..................... C23C 16/402 118/723 R |
| 2012/0119337 A1* | 5/2012 | Sasaki | .................. C23C 16/403 257/632 |

FOREIGN PATENT DOCUMENTS

| | | | |
|---|---|---|---|
| JP | 2002-134492 A | 5/2002 | |
| JP | 2009-059889 A | 3/2009 | |

(Continued)

OTHER PUBLICATIONS

Hausmann, Dennis M., et al., "Atomic Layer Deposition of Hafnium and Zirconium Oxides Using Metal Amide Precursors". Chem. Mater. 2002, 14, 4350-4358.*

(Continued)

*Primary Examiner* — Bret Chen
(74) *Attorney, Agent, or Firm* — Volpe and Koenig, P.C.

(57) ABSTRACT

A method of manufacturing a semiconductor device is provided which includes a step of performing a cycle, a predetermined number of times, to form a film on a substrate, the cycle including non-simultaneously performing: (a) a step of supplying a source gas to the substrate in a process chamber; (b) a step of removing the source gas from the process chamber; (c) a step of supplying a reactive gas having a chemical structure different from that of the source gas to the substrate in the process chamber; and (d) a step of removing the reactive gas from the process chamber, wherein the (d) includes alternately repeating: (d-1) a step of exhausting an inside of the process chamber to depressurize the inside of the process chamber; and (d-2) a step of purging the inside of the process chamber using an inert gas.

15 Claims, 20 Drawing Sheets

(52) U.S. Cl.
CPC .......... *C23C 16/36* (2013.01); *C23C 16/4412* (2013.01); *C23C 16/45531* (2013.01); *C23C 16/45546* (2013.01); *C23C 16/45557* (2013.01); *C23C 16/507* (2013.01); *H01L 21/0214* (2013.01); *H01L 21/0217* (2013.01); *H01L 21/02126* (2013.01); *H01L 21/02167* (2013.01); *H01L 21/02211* (2013.01); *H01L 21/02274* (2013.01)

(56) References Cited

FOREIGN PATENT DOCUMENTS

| JP | 2012-023221 A | 2/2012 |
|---|---|---|
| JP | 2013-077805 A | 4/2013 |
| KR | 10-2013-0030213 A | 3/2013 |

OTHER PUBLICATIONS

Min, Jae-Sik, et al., "Atomic Layer Deposition of TiN Films by Alternate Supply of Tetrakis(ethylmethylamino)-Titanium and Ammonia". Jpn. J. Appl. Phys. vol. 37 (1998) pp. 4999-5004.*

Kim, H., "Atomic layer deposition of metal and nitride thin films: Current research efforts and applications of semiconductor device processing". J. Vac. Sci. Technol. B 21(6), Nov./Dec. 2003, pp. 2231-2261.*

Japanese Office Action, JP Patent Application No. 2014-010556, Oct. 7, 2015, 15 pages (English translation provided).

Japanese Office Action, JP Patent Application No. 2014-010556, Jul. 29, 2015, 5 pgs. (English translation provided).

* cited by examiner

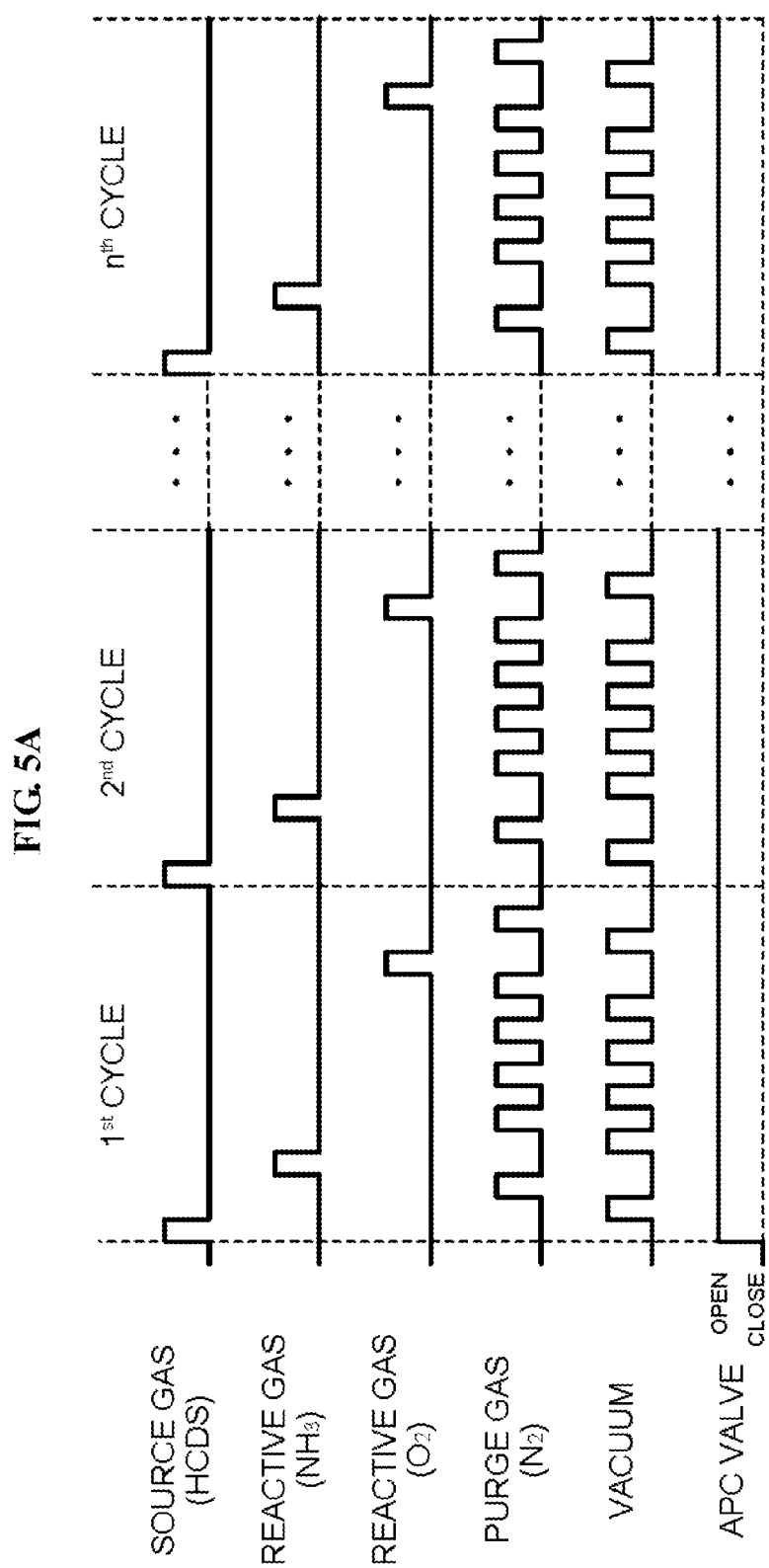

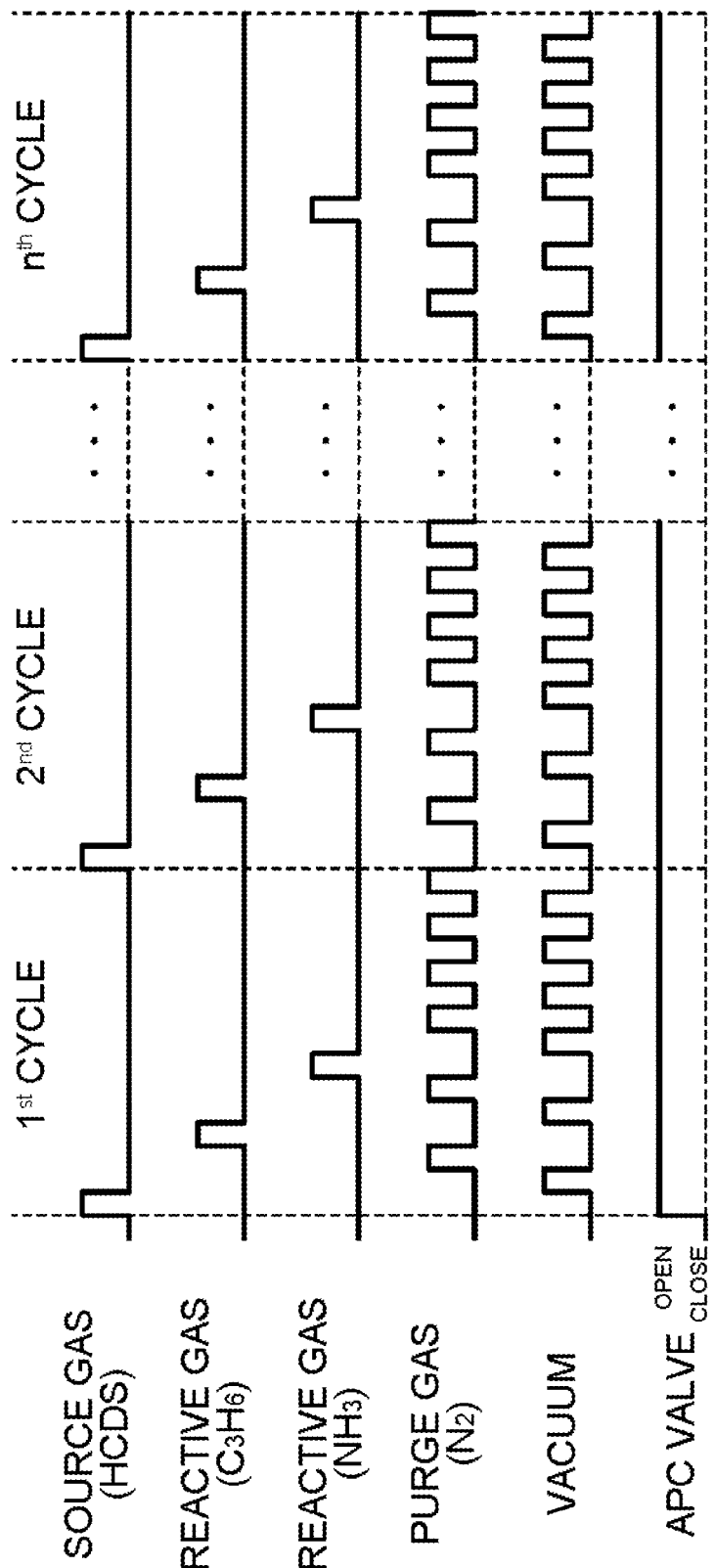

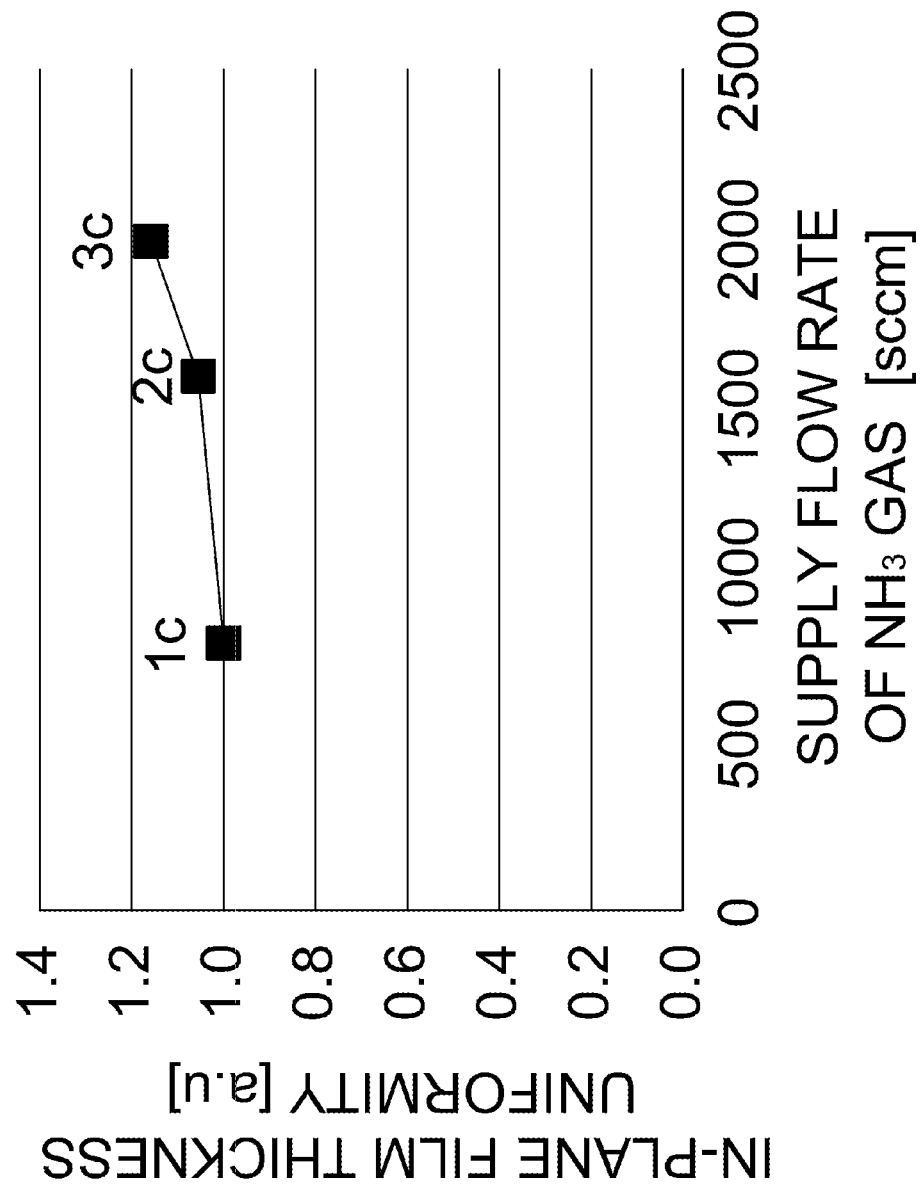

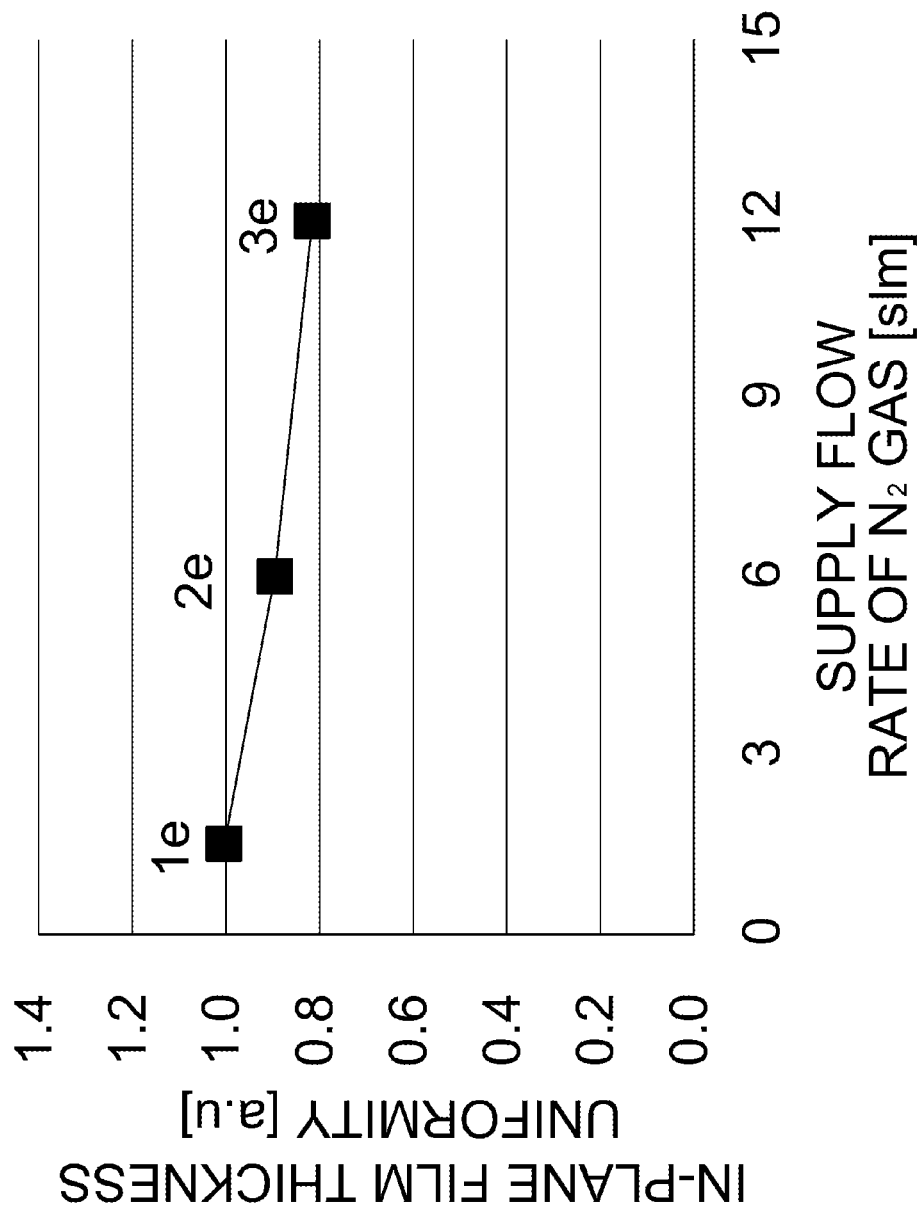

METHOD OF MANUFACTURING SEMICONDUCTOR DEVICE, INCLUDING FILM HAVING UNIFORM THICKNESS

CROSS-REFERENCE TO RELATED PATENT APPLICATION

This U.S. non-provisional Patent application claims priority under 35 U.S.C. §119 of Japanese Patent Application No. 2014-010556, filed on Jan. 23, 2014, in the Japanese Patent Office, the entire contents of which are hereby incorporated by reference.

BACKGROUND OF THE INVENTION

1. Field of the Invention

The present invention relates to a semiconductor device manufacturing method including a process of forming a thin film on a substrate, a substrate processing apparatus and a non-transitory computer-readable recording medium.

2. Description of the Related Art

For example, a process of forming a film, such as a nitride film, an oxynitride film, etc., on a substrate by performing, a predetermined number of times, a cycle of non-simultaneously performing a process of supplying a source gas to the substrate and a process of supplying a reactive gas to the substrate may be performed as a process included in a process of manufacturing a semiconductor device (device), such as a flash memory, a dynamic random access memory (DRAM), etc.

SUMMARY OF THE INVENTION

However, as semiconductor devices have been developed to be finer and to have a three-dimensional (3D) structure, the uniformity of the thickness of the film of a film to be formed on a substrate within a plane of the substrate may decrease when a surface area of the substrate increases. The present invention provides a technique of improving the uniformity of the thickness of the film of a film to be formed on a substrate within a plane of the substrate.

According to one aspect of the present invention, there is provided a method of manufacturing a semiconductor device including performing a cycle a predetermined number of times to form a film on a substrate, the cycle including non-simultaneously performing: (a) supplying a source gas to the substrate in a process chamber; (b) removing the source gas from the process chamber; (c) supplying a reactive gas having a chemical structure different from that of the source gas to the substrate in the process chamber; and (d) removing the reactive gas from the process chamber, wherein the (d) includes alternately repeating: (d-1) exhausting an inside of the process chamber to depressurize the inside of the process chamber; and (d-2) purging the inside of the process chamber using an inert gas.

BRIEF DESCRIPTION OF THE DRAWINGS

FIGS. 5A and 5B illustrate a first modified example and a second modified example of gas supply timing diagram of a film-forming sequence according to an embodiment of the present invention, respectively.

FIG. 6 illustrates a third modified example of gas supply timing diagram of a film-forming sequence according to an embodiment of the present invention.

FIG. 10A is a graph depicting the relationship between the uniformity of the thickness of the film of a SiN film within a plane of a wafer and a supply flow rate of $NH_3$ gas.

FIG. 11A is a graph depicting the relationship between the uniformity of the thickness of the film of a SiN film within a plane of a wafer and a supply flow rate of $N_2$ in a purging step when $NH_3$ gas was removed.

DETAILED DESCRIPTION OF THE PREFERRED EMBODIMENTS

An Embodiment of the Present Invention

An embodiment of the present invention will be described with reference to FIGS. 1 to 3 below.

(1) STRUCTURE OF SUBSTRATE PROCESSING APPARATUS

Figure 1:
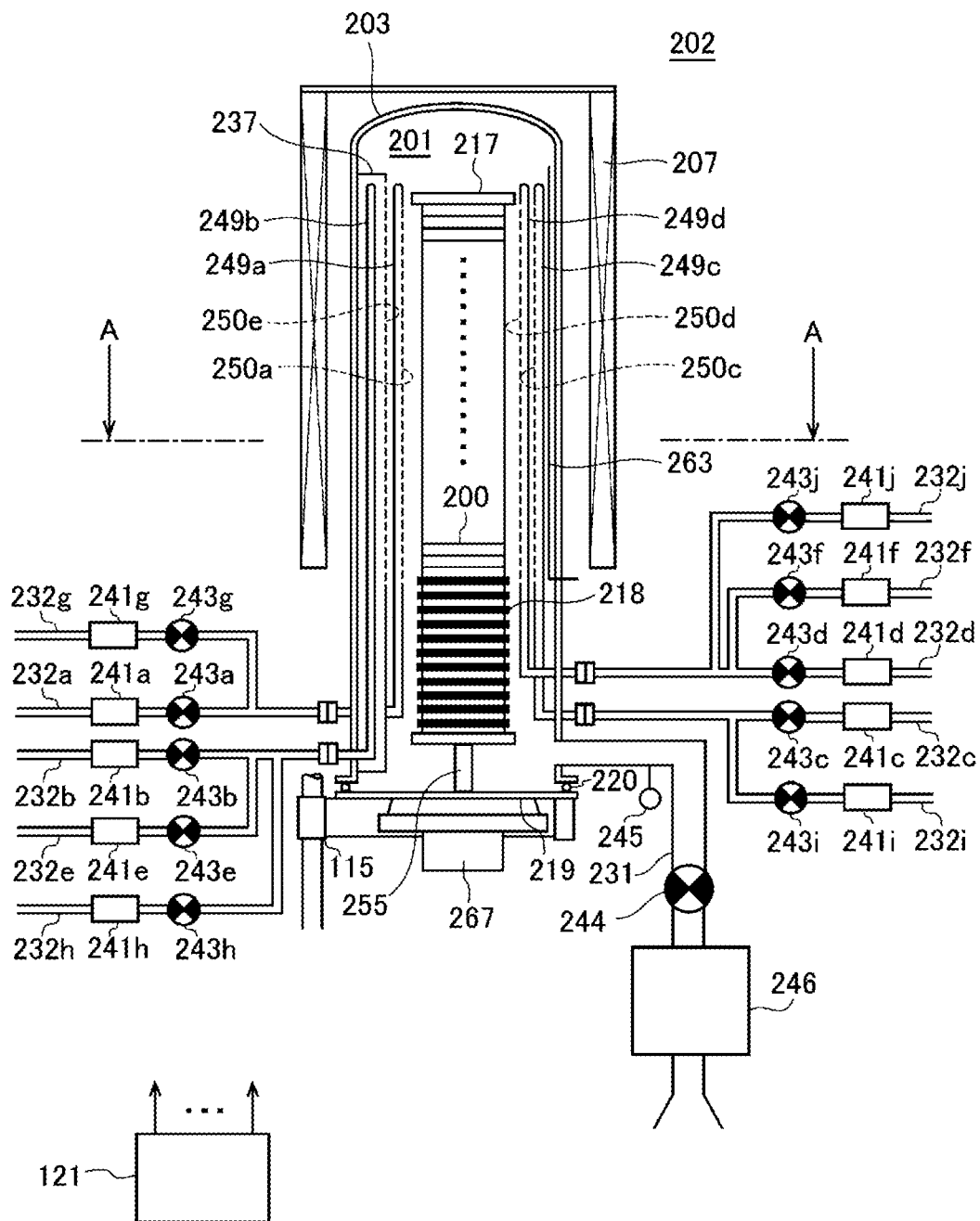
FIG. 1 is a schematic configuration diagram of a vertical process furnace of a substrate processing apparatus according to an embodiment of the present invention illustrating a vertical sectional view of a process furnace portion.

As illustrated in FIG. 1, a process furnace 202 includes a heater 207 serving as a heating means (heating mechanism). The heater 207 has a cylindrical shape, and is vertically installed by being supported by a heater base (not shown) as a retaining plate. The heater 207 may also act as an activating mechanism (exciting unit) that activates (excites) a gas by heat as will be described below.

At an inner side of the heater 207, a reaction tube 203 is installed concentrically with the heater 207 to form a reaction container (process container). The reaction tube 203 is formed of, for example, a heat-resistant material such as quartz ($SiO_2$) or silicon carbide (SiC), and has a cylindrical shape, the top end of which is closed and the bottom end of which is open. A process chamber 201 is formed in a hollow tubular portion of the reaction tube 203. The process chamber 201 is configured to accommodate wafers 200 serving as substrates in a state in which the wafers 200 are arranged vertically in a horizontal posture and a multi-stage manner through a boat 217 which will be described below.

In the process chamber 201, nozzles 249a to 249d are installed to pass through the bottom of the reaction tube 203. Gas supply pipes 232a to 232d are connected to the nozzles 249a to 249d, respectively. A gas supply pipe 232e is connected to the gas supply pipe 232b. A gas supply pipe 232f is connected to the gas supply pipe 232d. As described above, the four the nozzles 249a to 249d and the six gas supply pipes 232a to 232f are installed at the reaction tube 203 to supply a plurality of types of gases (here, six types of gases) into the process chamber 201.

The process furnace 202 according to the present embodiment is, however, not limited to the above embodiment. For example, a manifold formed of a metal may be installed below the reaction tube 203 to support the reaction tube 203, and the above nozzles may be installed to pass through a sidewall of the manifold. In this case, an exhaust pipe 231 which will be described below may be further installed at the manifold. Alternatively, the exhaust pipe 231 may be installed at the bottom of the reaction tube 203 rather than at the manifold. As described above, a furnace port portion of the process furnace 202 may be formed of a metal, and nozzles and the like may be installed at the furnace port portion formed of a metal.

Mass flow controllers (MFCs) 241a to 241f which are flow rate control units (flow rate controllers) and valves 243a to 243f which are opening/closing valves are sequentially installed on the gas supply pipes 232a to 232f from an upstream end. Gas supply pipes 232g to 232j configured to supply an inert gas are connected to the gas supply pipes 232a to 232d at downstream sides of the valves 243a to 243d, respectively. At the gas supply pipes 232g to 232j, MFCs 241g to 241j which are flow rate control units (flow rate controllers) and valves 243g to 243j which are opening/closing valves are sequentially installed from the upstream end.

The nozzles 249a, 249c and 249d are connected to front end portions of the gas supply pipes 232a, 232c and 232d, respectively. As illustrated in FIG. 2, the nozzles 249a, 249c and 249d are installed in an annular space between inner walls of the reaction tube 203 and the wafers 200 to move upward in a direction in which the wafers 200 are stacked, from the bottom of the inner walls of the reaction tube 203 to the top thereof. That is, the nozzles 249a, 249c and 249d are installed along a wafer arrangement region in which the wafers 200 are arranged in a region that horizontally surrounds the wafer arrangement region at a side of the wafer arrangement region. The nozzles 249a, 249c and 249d are configured as L-shaped long nozzles, the horizontal portions of which pass through lower sidewalls of the reaction tube 203 and the vertical portions of which move at least from one end of the wafer arrangement region toward another end thereof. Gas supply holes 250a, 250c and 250d configured to supply a gas are formed in side surfaces of the nozzles 249a, 249c and 249d, respectively. The gas supply holes 250a, 250c and 250d are open toward the center of the reaction tube 203 to supply a gas toward the wafers 200. The gas supply holes 250a, 250c and 250d are installed from the bottom of the reaction tube 203 to the top of the reaction tube 203 to have the same opening area and the same pitch.

The nozzle 249b is connected to a front end portion of the gas supply pipe 232b. The nozzle 249b is installed in a buffer chamber 237 which is a gas dispersion space. The buffer chamber 237 is a ring-shaped space between the inner walls of the reaction tube 203 and the wafers 200, and is installed in a region ranging from the bottom of the inner walls of the reaction tube 203 to the top thereof, in the direction in which the wafers 200 are stacked. That is, the buffer chamber 237 is installed along the wafer arrangement region in the region that horizontally surrounds the wafer arrangement region at the side of the wafer arrangement region. Gas supply holes 250e configured to supply a gas are installed on an end portion of a wall of the buffer chamber 237 adjacent to the wafers 200. The gas supply holes 250e are open toward the center of the reaction tube 203 to supply a gas toward the wafers 200. The gas supply holes 250e are installed from the bottom of the reaction tube 203 to the top thereof to have the same opening area and the same pitch.

The nozzle 249b is installed on an end portion of the buffer chamber 237 facing the end portion thereof on which the gas supply hole 250e is installed to move upward from the bottom of the inner walls of the reaction tube 203 in the direction in which the wafers 200 are stacked. That is, the nozzle 249b is installed along the wafer arrangement region in which the wafers 200 are arranged in the region that horizontally surrounds the wafer arrangement region at the side of the wafer arrangement region. The nozzle 249b is configured as an L-shaped long nozzle, the horizontal portion of which passes through the lower sidewalls of the reaction tube 203 and the vertical portion of which moves from at least one end of the wafer arrangement region toward another end thereof. Gas supply holes 250b configured to supply a gas are formed in a side surface of the nozzle 249b. The gas supply holes 250b are open toward the center of the reaction tube 203. Similar to the gas supply holes 250e, the gas supply holes 250b are installed from the bottom of the reaction tube 203 to the top of the reaction tube 203. When the difference between pressures in the buffer chamber 237 and the process chamber 201 is small, the opening areas and pitches of the gas supply holes 250b may be set to be the same from an upstream end (bottom) to a downstream end (top). When the difference between the pressures in the buffer chamber 237 and the process chamber 201 is large, the opening areas of the gas supply holes 250b may be set to gradually increase from the upstream end to the downstream end or the opening pitches of the gas supply holes 250b may be set to gradually decrease from the upstream end to the downstream end.

By adjusting the opening areas or pitches of the gas supply holes 250b from the upstream end to the downstream end as described above, gases may be discharged at the same flow rate via the respective gas supply holes 250b although the flow velocities of the gases are different. Also, by introducing the gases discharged via the respective gas supply holes 250b into the buffer chamber 237, the different flow velocities of the gases may be equalized in the buffer chamber 237. The speeds of particles of the gases supplied into the buffer chamber 237 via the respective gas supply holes 250b decrease in the buffer chamber 237 and are then supplied into the process chamber 201 via the respective gas supply holes 250e. The gases supplied into the buffer chamber 237 via the respective gas supply holes 250b are supplied into the process chamber 201 at the same flow rate and velocity via the respective gas supply holes 250e.

As described above, in the present embodiment, a gas is transferred via the nozzles 249a to 249d disposed in an annular and vertically long space, i.e., a cylindrical space, defined by the inner walls of the reaction tube 203 and end portions of the stacked wafers 200 and the buffer chamber 237. The gas is then first supplied into the reaction tube 203 near the wafers 200 via the gas supply holes 250a to 250e that are open in the nozzles 249a to 249d and the buffer chamber 237. Also, the gas is controlled to mainly flow into the reaction tube 203 in a direction that is parallel to surfaces of the wafers 200, i.e., a horizontal direction. Due to the above configuration, the gas may be uniformly supplied onto the wafers 200 to form a thin film on the wafers 200 to a uniform thickness. The gas flowing along the surfaces of the wafers 200, i.e., a residual gas remaining after a reaction, flows in a direction of an exhaust hole, i.e., an exhaust pipe 231 which will be described below. However, a direction in which the residual gas flows is appropriately defined by the location of the exhaust port and is not limited to a vertical direction.

For example, a halosilane source gas containing silicon (Si) and a halogen element as specific elements is supplied as a source gas containing a specific element into the process chamber 201 from the gas supply pipe 232a via the MFC 241a, the valve 243a and the nozzle 249a.

The halosilane source gas should be understood as a halosilane source that is in a gaseous state, e.g., a gas obtained by vaporizing a halosilane source that is in a liquid state at normal temperature and pressure, or a halosilane source that is in a gaseous state at normal temperature and pressure. The halosilane source should be understood as a silane source containing a halogen group. The halogen group includes a chloro group, a fluoro group, a bromo group, etc. That is, the halogen group includes halogen elements such as chlorine (Cl), fluorine (F), bromine (Br), etc. The halosilane source may be understood as a type of a halide. In the present disclosure, the term 'source' may be understood as a liquid source that is in a liquid state, a source gas that is in a gaseous state, or both.

For example, a source gas containing silicon (Si) and chlorine (Cl), i.e., chlorosilane source gas, may be used as halosilane source gas. For example, hexachlorodisilane ($Si_2Cl_6$, abbreviated as HCDS) gas may be used as the chlorosilane source gas. When a liquid source that is in a liquid state at normal temperature and pressure, e.g., HCDS, is used, the liquid source is vaporized using a vaporizing system, such as a vaporizer, a bubbler, etc., and supplied as a source gas (HCDS gas).

For example, a nitrogen-containing gas is supplied as a reactive gas having a different chemical structure (molecular structure) from that of the source gas into the process chamber 201 from the gas supply pipe 232b via the MFC 241b, the valve 243b, the nozzle 249b and the buffer chamber 237. For example, a hydrogen nitride-based gas may be used as the nitrogen-containing gas. The hydrogen nitride-based gas acts as a nitriding gas, i.e., a nitrogen (N) source, in a substrate processing process which will be described below. For example, ammonia ($NH_3$) gas may be used as the hydrogen nitride-based gas.

For example, an oxygen-containing gas is supplied as a reactive gas having a different chemical structure from that of the source gas into the process chamber 201 from the gas supply pipe 232e via the MFC 241e, the valve 243e, the gas supply pipe 232b, the nozzle 249b and the buffer chamber 237. The oxygen-containing gas acts as an oxidizing gas, i.e., an oxygen (O) source, in the substrate processing process which will be described below. For example, oxygen ($O_2$) gas may be used as the oxygen-containing gas.

For example, a carbon-containing gas is supplied as a reactive gas having a different chemical structure from that of the source gas into the process chamber 201 from the gas supply pipe 232c via the MFC 241c, the valve 243c and the nozzle 249c. For example, a hydrocarbon-based gas may be used as the carbon-containing gas. The hydrocarbon-based gas may be understood as a material consisting of only two elements, carbon (C) and hydrogen (H), and acts as a carbon (C) source in the substrate processing process which will be described below. For example, propylene ($C_3H_6$) gas may be used as the hydrocarbon-based gas.

For example, a boron-containing gas which does not contain a borazine ring skeleton is supplied as a reactive gas having a different chemical structure from that of the source gas into process chamber 201 from the gas supply pipe 232d via the MFC 241d, the valve 243d and the nozzle 249d. For example, a borane-based gas may be used as the boron-containing gas which does not contain a borazine ring skeleton.

The borane-based gas should be understood as a borane compound that is in a gaseous state, e.g., a gas obtained by vaporizing a borane compound which is in a liquid state at normal temperature and pressure, a borane compound which is in a gaseous state at normal temperature and pressure, etc. The borane compound includes a haloborane compound containing boron (B) and a halogen element, e.g., a chloroborane compound containing boron (B) and chlorine (Cl). Also, the borane compound includes borane (borohydride) such as monoborane ($BH_3$) or diborane ($B_2H_6$) and a borane compound (borane derivative) in which hydrogen (H) element of borane is replaced with another element, etc. The borane-based gas acts as a boron (B) source in the substrate processing process which will be described below. For example, trichloroborane ($BCl_3$) gas may be used as the borane-based gas. The $BCl_3$ gas is a boron-containing gas that does not contain a borazine compound, i.e., a non-borazine-based boron-containing gas.

For example, a gas containing a borazine ring skeleton is supplied as a reactive gas having a different chemical structure from that of the source gas into the process chamber 201 from the gas supply pipe 232f via the MFC 241f, the valve 243f, the gas supply pipe 232d and the nozzle 249d. For example, a gas containing a borazine ring skeleton and organic ligands, i.e., an organic borazine-based gas, may be used as the gas containing a borazine ring skeleton.

For example, a gas containing an alkyl borazine compound which is an organic borazine compound gas may be used as the organic borazine-based gas. The organic borazine-based gas may be also referred to as a borazine compound gas or a borazine-based gas.

Figure 13A:
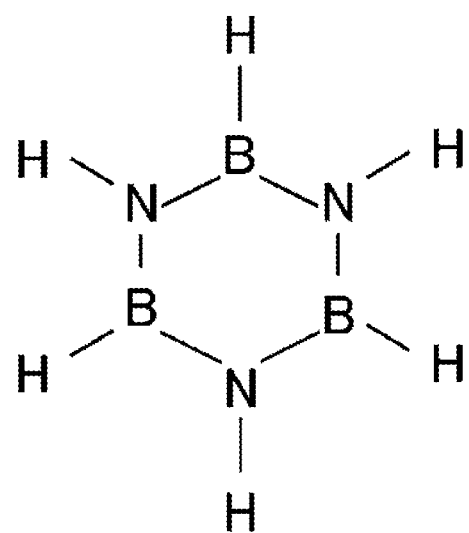
FIG. 13A illustrates a chemical structure of borazine.
Figure 13B:
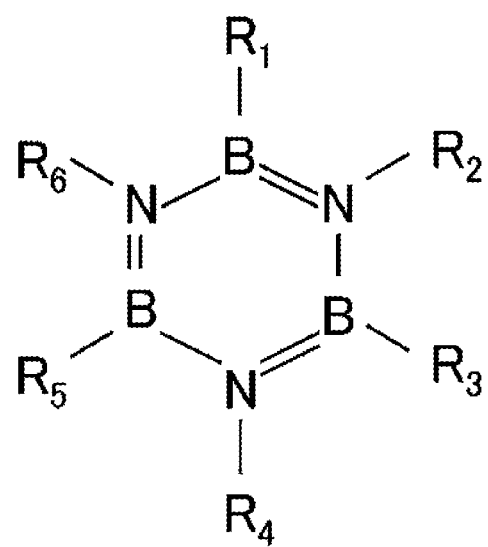
FIG. 13B illustrates a chemical structure of a borazine compound.

Here, borazine is a heterocyclic compound that consists of three elements, boron (B), nitrogen (N) and hydrogen (H), may be expressed in an empirical formula of $B_3H_6N_3$, and may be expressed as a chemical structure illustrated in FIG. 13A. The borazine compound is a compound containing a borazine ring skeleton (which is also referred to as a borazine skeleton) forming a borazine ring consisting of three boron (B) atoms and three nitrogen (N) atoms. The organic borazine compound is a borazine compound containing carbon (C), or may be a borazine compound containing a carbon (C)-containing ligand, i.e., organic ligands. The alkyl borazine compound is a borazine compound containing an alkyl group, and may be a borazine compound containing an alkyl group as an organic ligand. The alkyl borazine compound has a structure in which at least one among six hydrogen (H) atoms contained in borazine is replaced with a hydrocarbon containing at least one carbon (C) atom, and may be expressed as a chemical structure illustrated in FIG. 13B. In the chemical structure illustrated in FIG. 13B, each of $R_1$ through $R_6$ represent hydrogen (H) or an alkyl group containing one to four carbon (C) elements. $R_1$ through $R_6$ may be the same type of alkyl groups or different types of alkyl groups. However, $R_1$ through $R_6$ may not be all hydrogen (H). The alkyl borazine compound may be understood as a material containing a borazine ring skeleton forming a borazine ring, and including boron (B), nitrogen (N), hydrogen (H) and carbon (C). Also, the alkyl borazine compound may be understood as a material containing a borazine ring skeleton and an alkyl ligand. Alternatively, each of $R_1$ through $R_6$ may be hydrogen (H) or an alkenyl group or an alkynyl group containing one to four carbon (C) atoms. $R_1$ through $R_6$ may be the same type of alkenyl groups or alkynyl groups or different types of alkenyl groups or alkynyl groups. However, $R_1$ through $R_6$ may not all be hydrogen (H).

The borazine-based gas may act as a boron (B) source, a nitrogen (N) source and a carbon (C) source in the substrate processing process which will be described below.

Figure 13C:
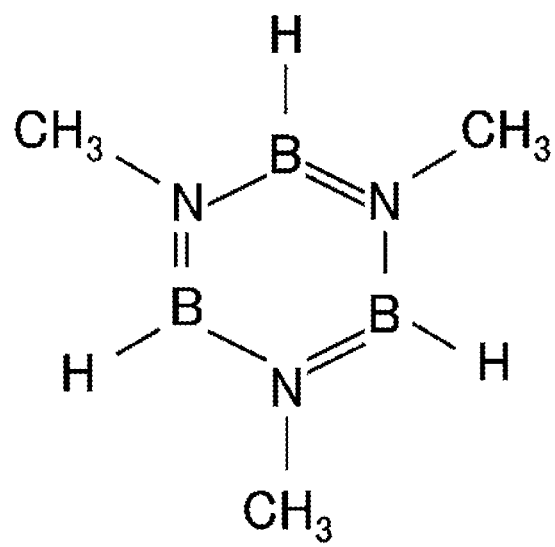
FIG. 13C illustrates a chemical structure of n,n',n"-trimetyleborazine.
Figure 13D:
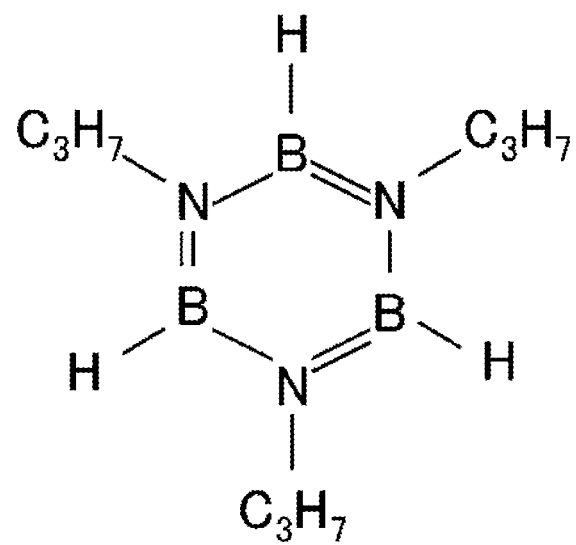
FIG. 13D illustrates a chemical structure of n,n',n"-tri-n-propylborazine.

For example, n,n',n''-trimethylborazine (abbreviated as TMB) gas, n,n',n''-triethylborazine (abbreviated as TEB) gas, n,n',n''-tri-n-propylborazine (abbreviated as TPB) gas, n,n',n''-triisopropyl borazine (abbreviated as TIPB) gas, n,n',n''-tri-n-butylborazine (abbreviated as TBB) gas, n,n',n''-triisobutyl borazine (abbreviated as TIBB) gas, etc. may be used as the borazine-based gas. TMB is a borazine compound expressed as a chemical structure shown in FIG. 13C which has the chemical structure shown in FIG. 13B where each of $R_1$, $R_3$ and $R_5$ is substituted with hydrogen (H) and each of $R_2$, $R_4$ and $R_6$ with a methyl group. TEB is a borazine compound which has the chemical structure shown in FIG. 13B where each of $R_1$, $R_3$ and $R_5$ is substituted with hydrogen (H) and each of $R_2$, $R_4$ and $R_6$ with an ethyl group. TPB is a borazine compound expressed as a chemical structure shown FIG. 13D which has the chemical structure shown in FIG. 13B where each of $R_1$, $R_3$ and $R_5$ substituted with hydrogen (H) and $R_2$, $R_4$ and $R_6$ with a propyl group. TIPB is a borazine compound which has the chemical structure shown in FIG. 13B where each of $R_1$, $R_3$ and $R_5$ substituted with hydrogen (H) and $R_2$, $R_4$ and $R_6$ with an isopropyl group. TIBB is a borazine compound which has the chemical structure shown in FIG. 13B where $R_1$, $R_3$ and $R_5$ substituted with hydrogen (H) and $R_2$, $R_4$ and $R_6$ with an isobutyl group.

When a borazine compound which is in a liquid state at normal temperature and pressure, e.g., TMB, is used, the borazine compound that is in a liquid state may be vaporized using a vaporizing system, such as a vaporizer, a bubbler, etc., and provided as a borazine-based gas (TMB gas, etc).

For example, nitrogen ($N_2$) gas supplied as an inert gas into the process chamber 201 from the gas supply pipes 232g to 232j via the MFCs 241g to 241j, the valves 243g to 243j, the gas supply pipes 232a to 232d, the nozzles 249a to 249d and the buffer chamber 237.

When the above gases are supplied through the gas supply pipes, a source gas supply system that supplies a source gas containing a specific element is mainly configured with the gas supply pipe 232a, the MFC 241a and the valve 243a. The nozzle 249a may be further included in the source gas supply system. The source gas supply system may be also referred to as a source supply system. When halosilane source gas is supplied through the gas supply pipe 232a, the source gas supply system may be referred to as a halosilane source gas supply system or a halosilane source supply system.

Also, a nitrogen-containing gas supply system that supplies a nitrogen-containing gas is mainly configured with the gas supply pipe 232b, the MFC 241b and the valve 243b. The nozzle 249b and the buffer chamber 237 may be further included in the nitrogen-containing gas supply system. The nitrogen-containing gas supply system may be also referred to as a nitriding gas supply system or a nitrating agent supply system. When a hydrogen nitride-based gas is supplied through the gas supply pipe 232b, the nitrogen-containing gas supply system may be referred to as a hydrogen nitride-based gas supply system or a hydronitrogen supply system.

An oxygen-containing gas supply system that supplies an oxygen-containing gas is mainly configured with the gas supply pipe 232e, the MFC 241e and the valve 243e. A portion of the gas supply pipe 232b at a downstream side of an interface between the gas supply pipe 232b and the gas supply pipe 232e, the nozzle 249b and the buffer chamber 237 may be further included in the oxygen-containing gas supply system. The oxygen-containing gas supply system may be also referred to as an oxidizing gas supply system or an oxidizing agent supply system.

A carbon-containing gas supply system that supplies a carbon-containing gas is mainly configured with the gas supply pipe 232c, the MFC 241c and the valve 243c. The nozzle 249c may be further included in the carbon-containing gas supply system. When a hydrocarbon-based gas is supplied through the gas supply pipe 232c, the carbon-containing gas supply system may be referred to as a hydrocarbon-based gas supply system or a hydrocarbon supply system.

A boron-containing gas supply system that supplies a boron-containing gas that does not contain a borazine ring skeleton, i.e., a non-borazine-based boron-containing gas, is mainly configured by the gas supply pipe 232d, the MFC 241d and the valve 243d. The nozzle 249d may be further included in the boron-containing gas supply system. When a borane-based gas is supplied through the gas supply pipe 232d, the boron-containing gas supply system may be referred to as a borane-based gas supply system or a borane compound supply system.

A borazine-based gas supply system that supplies a gas containing a borazine ring skeleton, i.e., a borazine-based gas, is mainly configured with the gas supply pipe 232f, the MFC 241f and the valve 243f. A portion of the gas supply pipe 232d at a downstream side of an interface between the gas supply pipe 232d and the gas supply pipe 232f, and the nozzle 249d may be further included in the borazine-based gas supply system. The borazine-based gas supply system may be also referred to as an organic borazine-based gas supply system or a borazine compound supply system.

Any one or all of the nitrogen-containing gas supply system, oxygen-containing gas supply system, carbon-containing gas supply system, boron-containing gas supply system and the borazine-based gas supply system may be referred to as a reactive gas supply system that supplies a reactive gas.

An inert gas supply system is mainly configured with the gas supply pipes 232g to 232j, the MFCs 241g to 241j and the valves 243g to 243j. The inert gas supply system may be also referred to as a purge gas supply system or a carrier gas supply system.

Figure 2:
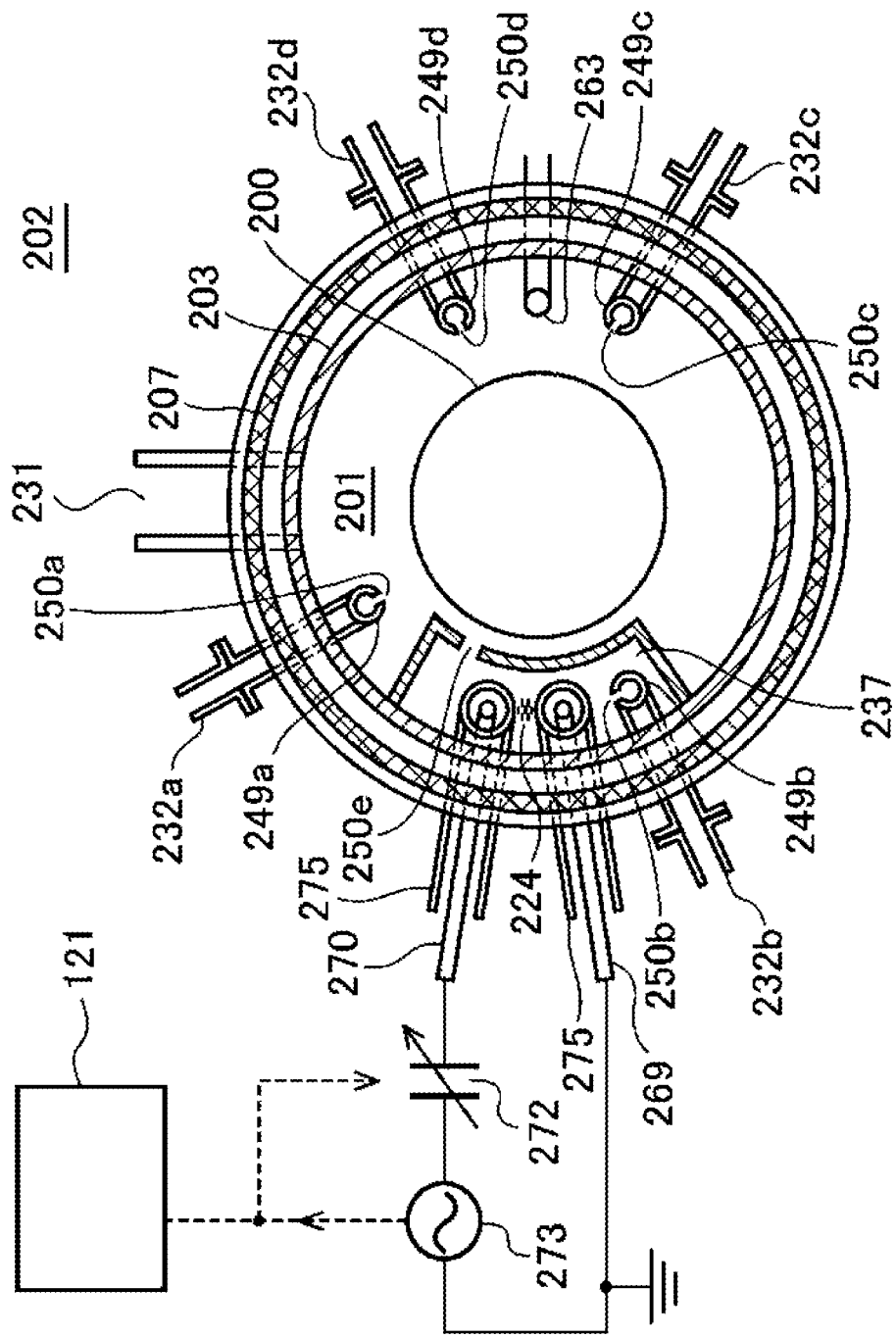
FIG. 2 is a schematic configuration diagram of a vertical process furnace of a substrate processing apparatus according to the embodiment of the present invention illustrating a cross-sectional view of a process furnace portion taken along line A-A of FIG. 1.

As illustrated in FIG. 2, in the buffer chamber 237, two rod-shaped electrodes 269 and 270 formed of a conductive material and having a slender and long structure are installed from the bottom of the reaction tube 203 to the top of the reaction tube 203 in the direction in which the wafers 200 are stacked. The rod-shaped electrodes 269 and 270 are installed in parallel with the nozzle 249b. The rod-shaped electrodes 269 and 270 are protected by being covered with electrode protection pipes 275 from top to bottom. One of the rod-shaped electrodes 269 and 270 is connected to a high-frequency power source 273 via a matching device 272, and the other rod-shaped electrode 269 or 270 is connected to the ground having a reference potential. When radio-frequency (RF) power is supplied between the rod-shaped electrodes 269 and 270 from the high-frequency power source 273 via the matching device 272, plasma is generated in a plasma generation region 224 between the rod-shaped electrodes 269 and 270. A plasma source serving as a plasma generator (plasma generation unit) mainly includes the rod-shaped electrodes 269 and 270 and the electrode protection pipes 275. The matching device 272 and the high-frequency power source 273 may be further included in the plasma source. The plasma source acts as an activating mechanism (excitation unit) that activates (excites) a gas into a plasma state as will be described below.

The electrode protection pipes 275 are configured to be inserted into the buffer chamber 237 in a state in which the rod-shaped electrodes 269 and 270 are isolated from an atmosphere in the buffer chamber 237. When the concentration of oxygen in the electrode protection pipe 275 is substantially the same as the concentration of oxygen in the air (atmosphere), the rod-shaped electrodes 269 and 270 inserted into the electrode protection pipe 275 are oxidized by heat generated from the heater 207. When the inside of the electrode protection pipe 275 is filled with an inert gas such as $N_2$ gas or is purged with an inert gas such as $N_2$ gas using an inert gas purging mechanism, the concentration of oxygen in the electrode protection pipe 275 may decrease to prevent the rod-shaped electrodes 269 and 270 from being oxidized.

The exhaust pipe 231 is installed in the reaction tube 203 to exhaust an atmosphere in the process chamber 201. A pressure sensor 245 serving as a pressure detector (pressure detection unit) for detecting an inner pressure of the process chamber 201 is connected to the exhaust pipe 231. A vacuum pump 246 serving as a vacuum exhaust device is connected to the exhaust pipe 231 via an auto pressure controller (APC) valve 244 serving as a pressure controller (pressure control unit). The APC valve 244 is configured to perform or suspend vacuum-exhaust in the process chamber 201 by opening/closing the APC valve 244 while the vacuum pump 246 is operated, and to adjust the inner pressure of the process chamber 201 by controlling the degree of openness the APC valve 244 based on pressure information detected by the pressure sensor 245 while the vacuum pump 246 is operated. An exhaust system mainly includes the exhaust pipe 231, the APC valve 244 and the pressure sensor 245. The vacuum pump 246 may be further included in the exhaust system.

Below the reaction tube 203, a seal cap 219 is installed as a furnace port lid for air-tightly closing a lower end aperture of the reaction tube 203. The seal cap 219 is configured to come in contact with a lower end of the reaction tube 203 from below in a vertical direction. The seal cap 219 is formed of, for example, a metal, such as stainless steel (SUS), and has a disk shape. An O-ring 220 serving as a seal member that comes in contact with the lower end of the reaction tube 203 is installed on an upper surface of the seal cap 219. A rotation mechanism 267 that rotates the boat 217 which will be described below is installed at a side of the seal cap 219 opposite to the process chamber 201. A rotation shaft 255 of the rotation mechanism 267 is connected to the boat 217 while passing through the seal cap 219. The rotation mechanism 267 is configured to rotate the wafers 200 by rotating the boat 217. The seal cap 219 is configured to be vertically moved by a boat elevator 115 that is a lifting mechanism vertically installed outside the reaction tube 203. The boat elevator 115 is configured to load the boat 217 into or unload the boat 217 from the process chamber 201 by moving the seal cap 219 upward/downward. That is, the boat elevator 115 is configured as a transfer device (transfer mechanism) that transfers the boat 217, i.e., the wafers 200, into or out of the process chamber 201.

The boat 217, which is a substrate retaining mechanism, is configured to support a plurality of wafers 200 (e.g., 25 to 200 wafers 200) to be vertically arranged in a horizontal posture and a concentric fashion, in a multistage manner, i.e., to be arranged to be spaced apart from each other. The boat 217 is formed of a heat-resistant material such as quartz or SiC. Below the boat 217, insulating boards 218 formed of a heat-resistant material (e.g., quartz or SiC) are supported in a horizontal posture and a multistage manner. Due to the above structure, heat generated from the heater 207 is suppressed from being transferred to the seal cap 219. However, the present invention is not limited to the above embodiment. For example, an insulating container which is a cylindrical member formed of a heat-resistant material (e.g., quartz or SiC) may be installed below the boat 217 instead of the insulating boards 218.

In the reaction tube 203, a temperature sensor 263 is installed as a temperature detector. The temperature in the process chamber 201 may be controlled to have a desired temperature distribution by controlling an amount of electric current to be supplied to the heater 207 based on temperature information detected by the temperature sensor 263. The temperature sensor 263 has an L shape similar to the nozzles 249a to 249d, and is installed along the inner wall of the reaction tube 203.

Figure 3:
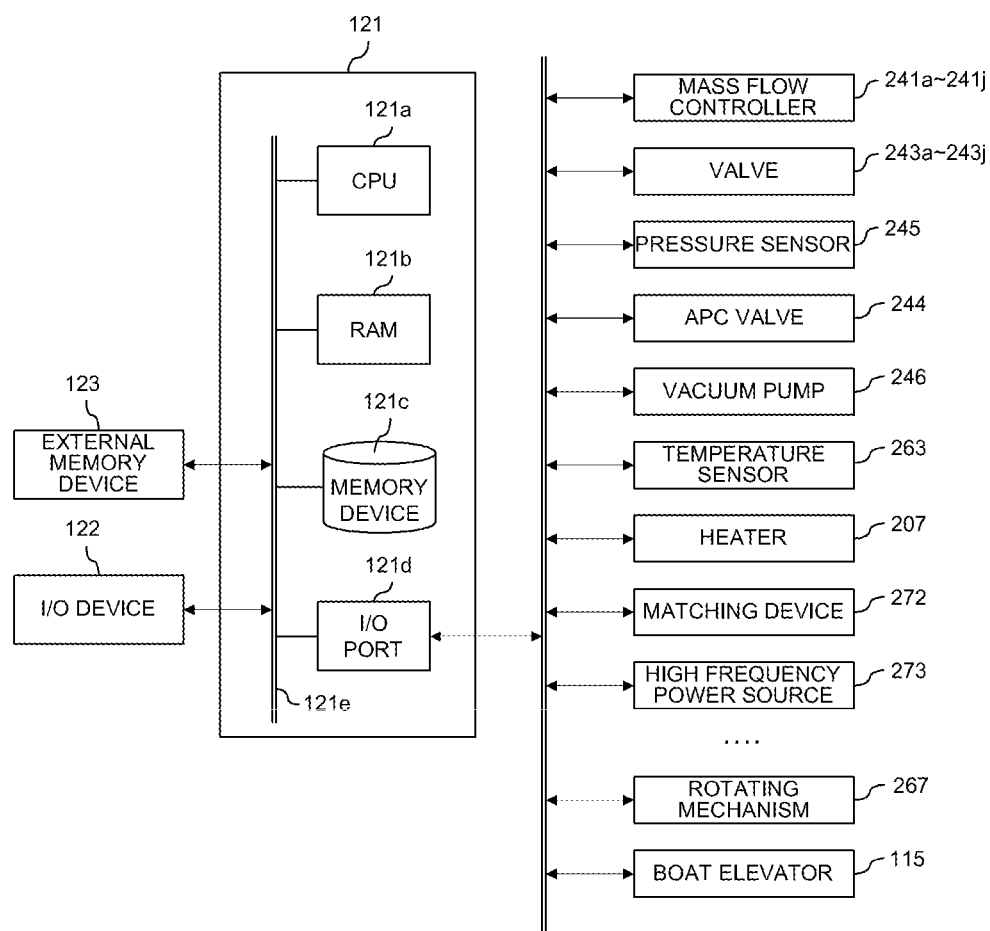
FIG. 3 is a schematic configuration diagram of a controller of a substrate processing apparatus according to an embodiment of the present invention illustrating a block diagram of a control system of the controller.

As illustrated in FIG. 3, a controller 121 which is a control unit (control means) is configured as a computer including a central processing unit (CPU) 121a, a random access memory (RAM) 121b, a memory device 121c and an input/output (I/O) port 121d. The RAM 121b, the memory device 121c and the I/O port 121d are configured to exchange data with the CPU 121a via an internal bus 121e. An I/O device 122 configured as a touch panel or the like is connected to the controller 121.

The memory device 121c is configured, for example, as a flash memory, a hard disk drive (HDD), etc. In the memory device 121*c*, a control program for controlling an operation of a substrate processing apparatus, a process recipe including the order or conditions of substrate processing which will be described below, or the like is stored to be readable. The process recipe is a combination of sequences of a substrate processing process which will be described below to obtain a desired result when the sequences are performed by the controller 121, and acts as a program. Hereinafter, the process recipe, the control program, etc. will be referred to together simply as a 'program.' When the term 'program' is used in the present disclosure, it may be understood as including only a process recipe, only a control program, or both of the process recipe and the control program. The RAM 121*b* is configured as a memory area (work area) in which a program or data read by the CPU 121*a* is temporarily stored.

The I/O port 121*d* is connected to the MFCs 241*a* to 241*j*, the valves 243*a* to 243*j*, the pressure sensor 245, the APC valve 244, the vacuum pump 246, the heater 207, the temperature sensor 263, the high-frequency power source 273, the matching device 272, the temperature sensor 263, the rotation mechanism 267, the boat elevator 115, etc.

The CPU 121*a* is configured to read and execute the control program from the memory device 121*c* and to read the process recipe from the memory device 121*c* according to a manipulation command received via the I/O device 122. The CPU 121*a* is configured to, based on the read process recipe, control the flow rates of various gases via the MFCs 241*a* to 241*j*; control opening/closing of the valves 243*a* to 243*j*; control opening/closing of the APC valve 244; control the degree of pressure using the APC valve 244, based on the pressure sensor 245; control driving/suspending of the vacuum pump 246; control temperature using the heater 207 based on the temperature sensor 263; control power supply from the high-frequency power source 273; control impedance using the matching device 272; control the rotation and rotation speed of the boat 217 using the rotation mechanism 267; control upward/downward movement of the boat 217 using the boat elevator 115, etc.

The controller 121 is not limited to a dedicated computer and may be configured as a general-purpose computer. For example, the controller 121 according to the present embodiment may be configured by providing an external memory device 123 storing a program as described above, e.g., a magnetic disk (e.g., a magnetic tape, a flexible disk, a hard disk, etc.), an optical disc (e.g., a com Pact disc (CD), a digital versatile disc (DVD), etc.), a magneto-optical (MO) disc, or a semiconductor memory (e.g., a Universal Serial Bus (USB) memory, a memory card, etc.), and then installing the program in a general-purpose computer using the external memory device 123. However, the means for supplying a program to a computer are not limited to using the external memory device 123. For example, a program may be supplied to a computer using a communication means, e.g., the Internet or an exclusive line, without using the external memory device 123. The memory device 121*c* or the external memory device 123 may be configured as a non-transitory computer-readable recording medium. Hereinafter, the memory device 121*c* and the external memory device 123 may also be referred to together simply as a 'recording medium.' When the term 'recording medium' is used in the present disclosure, it may be understood as only the memory device 121*c*, only the external memory device 123, or both of the memory device 121*c* and the external memory device 123.

(2) SUBSTRATE PROCESSING PROCESS

An example of a sequence of forming a film on a substrate using the substrate processing apparatus described above will now be described as a process included in a process of manufacturing a semiconductor device (device) with reference to FIG. 4. In the following description, operations of various elements of the substrate processing apparatus are controlled by the controller 121.

Figure 4:
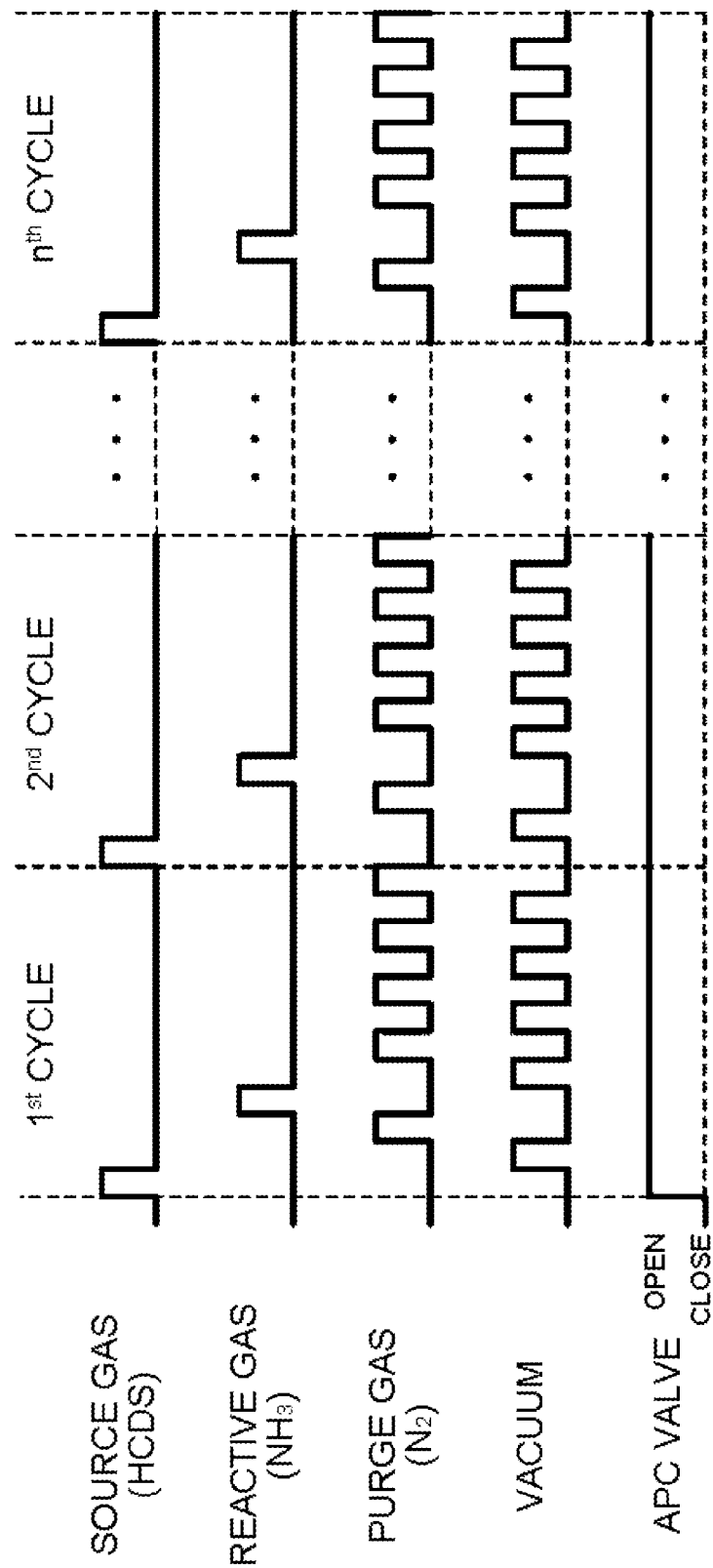
FIG. 4 illustrates gas supply timing diagram of a film-forming sequence according to an embodiment of the present invention.

In the film-forming sequence illustrated in FIG. 4, a cycle of performing non-simultaneously (i.e., in a non-synchronous manner) a process of supplying HCDS gas as a source gas onto the wafer 200 serving as a substrate in the chamber 201; a process of removing the HCDS gas from the inside of the process chamber 201; a process of supplying $NH_3$ gas as a reactive gas having a different chemical structure than that of the HCDS gas onto the wafer 200 in the process chamber 201; and a process of removing the $NH_3$ gas from the inside of the process chamber 201 is performed a predetermined number of times (n times) to form a silicon nitride (SiN) film containing silicon (Si) and nitrogen (N) on the wafer 200.

In the process of removing the $NH_3$ gas, a process of exhausting the inside of the process chamber 201 to depressurize the inside of the process chamber 201 and a process of purging the inside of the process chamber 201 with an inert gas are alternately and repeatedly performed.

Here, the performing of the cycle the predetermined number of times should be understood as performing the cycle once or a plurality of times. That is, this means that the cycle is performed once or more. FIG. 4 illustrates a case in which the above cycle is repeatedly performed n times.

When the term 'wafer' is used in the present disclosure, it should be understood as either the wafer itself, or both the wafer and a stacked structure (assembly) including a layer/film formed on the wafer (i.e., the wafer and the layer/film formed thereon may also be referred to collectively as the 'wafer'). Also, when the expression 'surface of the wafer' is used in the present disclosure, it should be understood as either a surface (exposed surface) of the wafer itself or a surface of a layer/film formed on the wafer, i.e., an uppermost surface of the wafer as a stacked structure.

Thus, in the present disclosure, the expression 'specific gas is supplied onto a wafer' should be understood to mean that the specific gas is directly supplied onto a surface (exposed surface) of the wafer or that the specific gas is supplied onto a surface of a layer/film on the wafer, i.e., on the uppermost surface of the wafer as a stacked structure. Also, in the present disclosure, the expression 'a layer (or film) is formed on the wafer' should be understood to mean that the layer (or film) is directly formed on a surface (exposed surface) of the wafer itself or that the layer (or film) is formed on a layer/film on the wafer, i.e., on the uppermost surface of the wafer as a stacked structure.

In the present disclosure, the term 'substrate' has the same meaning as the term 'wafer.' Thus, the term 'wafer' may be used interchangeably with the term 'substrate.'

(Wafer Charging and Boat Loading)

A plurality of wafers 200 are placed in the boat 217 (wafer charging). Next, the boat 217 supporting the plurality of wafers 200 is lifted by the boat elevator 115 and loaded into the process chamber 201 as illustrated in FIG. 1 (boat loading). In this state, the lower end of the reaction tube 203 is blocked by the seal cap 219 via the O-ring 220.

(Pressure & Temperature Control)

The inside of the process chamber 201 (i.e., the space in which the wafers 200 are present) is vacuum-exhausted to a desired pressure (degree of vacuum) by the vacuum pump 246. In this case, the inner pressure of the process chamber 201 is measured by the pressure sensor 245, and the APC valve 244 is feedback-controlled based on information regarding the measured pressure (pressure control). In FIG.

4, "OPEN" and "CLOSE" should be understood simply as an open state and a closed state of the APC valve 244 and should not be understood as the degrees of openness of the APC valve 244. The vacuum pump 246 is continuously operated at least until processing of the wafers 200 is completed. Also, the wafers 200 in the process chamber 201 are heated to a desired temperature by the heater 207. In this case, an amount of electric current supplied to the heater 207 is feedback-controlled based on temperature information detected by the temperature sensor 263, so that the inside of the process chamber 201 may have a desired temperature distribution. The inside of the process chamber 201 is continuously heated by the heater 207 at least until the processing of the wafers 200 is completed. Then, rotation of the boat 217 and the wafers 200 by the rotation mechanism 267 begins. Also, the rotation of the boat 217 and the wafers 200 by the rotation mechanism 267 is continuously performed at least until the processing of the wafers 200 is completed.

(SiN Film Forming Process)

Next, the following two steps, i.e., steps 1 and 2, are sequentially performed.

[Step 1] (Supply of HCDS Gas)

The valve 243a is opened to supply HCDS gas into the gas supply pipe 232a. The flow rate of the HCDS gas is adjusted by the MFC 241a, and then the HCDS gas is supplied into the process chamber 201 via the gas supply hole 250a and exhausted via the exhaust pipe 231. At this time, the HCDS gas is supplied onto the wafer 200. At the same time, the valve 243g is opened to supply $N_2$ gas into the gas supply pipe 232g. The flow rate of the $N_2$ gas is adjusted by the MFC 241g, and then $N_2$ gas is supplied into the process chamber 201 together with the HCDS gas and exhausted via the exhaust pipe 231.

The valves 243h to 243j are opened to supply $N_2$ gas into the gas supply pipes 232h to 232j so as to prevent the HCDS gas from flowing into the nozzles 249b to 249d and the buffer chamber 237. The $N_2$ gas is supplied into the process chamber 201 via the gas supply pipes 232b to 232d, the nozzles 249b to 249d and the buffer chamber 237, and is exhausted via the exhaust pipe 231.

In this case, the APC valve 244 is appropriately controlled to set the inner pressure of the process chamber 201 to range, for example, from 1 Pa to 2,666 Pa, and preferably, from 67 Pa to 1,333 Pa. The supply flow rate of the HCDS gas is controlled by the MFC 241a to range, for example, from 1 sccm to 2,000 sccm, and preferably, from 10 sccm to 1,000 sccm. The supply flow rate of the $N_2$ gas is controlled by the MFCs 241g to 241j to range, for example, from 100 sccm to 10,000 sccm. A duration for which the HCDS gas is supplied onto the wafer 200, i.e., a gas supply time (irradiation time), is set to range, for example, from 1 to 120 seconds, and preferably, from 1 to 60 seconds. The temperature of the heater 207 is set such that the temperature of the wafer 200 ranges, for example, from 250° C. to 700° C., preferably, from 300° C. to 650° C., and more preferably, from 350° C. to 600° C.

When the temperature of the wafer 200 is less than 250° C., the HCDS may be difficult to be chemically adsorbed onto the wafer 200, thereby preventing a practical film forming speed from being achieved. This problem is solved when the temperature of the wafer 200 is set to be 250° C. or higher. When the temperature of the wafer 200 is set to be 300° C. or higher or 350° C. or higher, the HCDS gas may be more sufficiently adsorbed onto the wafer 200, thereby achieving a more sufficient film-forming rate.

When the temperature of the wafer 200 exceeds 700° C., a chemical vapor deposition (CVD) reaction becomes stronger (gas-phase reaction is dominant), and the uniformity of the thickness of the film is likely to be degraded and may thus be difficult to control. When the temperature of the wafer 200 is controlled to be 700° C. or lower, the uniformity of the thickness of the film may be prevented from being degraded and thus be controlled. In particular, when the temperature of wafer 200 is controlled to be 650° C. or lower or 600° C. or lower, a surface reaction becomes dominant, and the uniformity of the thickness of the film may be easily achieved and thus be easily controlled.

Thus, the temperature of the wafer 200 may be controlled to range from 250 to 700° C., preferably, from 300 to 650° C., and more preferably, from 350 to 600° C.

Under the conditions described above, the HCDS gas is supplied onto the wafer 200 to form a silicon-containing layer containing chlorine (Cl) as a first layer on the wafer 200 (an underlying film formed on the wafer 200) to a thickness of less than one atomic layer to several atomic layers. The silicon-containing layer containing chlorine (Cl) may include a silicon (Si) layer containing chlorine (Cl), an adsorption layer of the HCDS gas, or both of these layers.

The silicon (Si) layer containing chlorine (Cl) generally refers to all layers including a continuous layer formed of silicon (Si) and containing chlorine (Cl), a discontinuous layer formed of silicon (Si) and containing chlorine (Cl), and a silicon (Si) thin film containing chlorine (Cl) and formed by overlapping the continuous layer and the discontinuous layer. The continuous layer formed of silicon (Si) and containing chlorine (Cl)) may also be referred to as a silicon (Si) thin film containing chlorine (Cl). Silicon (Si) used to form the silicon (Si) layer containing chlorine (Cl) should be understood as including not only silicon (Si) from which a bond with chlorine (Cl) is not completely broken but also silicon (Si) from which the bond with chlorine (Cl) is completely broken.

Examples of the adsorption layer of the HCDS gas include not only an adsorption layer including continuous gas molecules of the HCDS gas but also an adsorption layers including discontinuous gas molecules of the HCDS gas. That is, the adsorption layer of the HCDS gas includes an adsorption layer formed of HCDS molecules to a thickness of one molecular layer or less than one molecular layer. The HCDS molecules of the adsorption layer of the HCDS gas may have a chemical formula in which a bond between silicon (Si) and chlorine (Cl) is partially broken. That is, the adsorption layer of the HCDS gas should be understood as including a physical adsorption layer of HCDS gas, a chemical adsorption layer of HCDS gas, or both.

A layer having a thickness of less than one atomic layer means a discontinuously formed atomic layer, and a layer having a thickness of one atomic layer means a continuously formed atomic layer. A layer having a thickness of less than one molecular layer means a discontinuously formed molecular layer, and a layer having a thickness of one molecular layer means a continuously formed molecular layer. The silicon (Si)-containing layer containing chlorine (Cl) should be understood as including a silicon (Si) layer containing chlorine (Cl), an adsorption layer of HCDS gas, or both. However, expressions such as 'one atomic layer' and 'several atomic layers' are used with respect to the silicon (Si)-containing layer containing chlorine (Cl) as described above.

Silicon (Si) is deposited on the wafer 200 to form a silicon (Si) layer containing chlorine (Cl) under conditions in which HCDS gas is self-decomposed (pyrolyzed), i.e., conditions causing a pyrolysis reaction of the HCDS gas. The HCDS gas is adsorbed onto the wafer 200 to form an adsorption layer of the HCDS gas under conditions in which HCDS gas is not self-decomposed (pyrolyzed), i.e., conditions that do not cause a pyrolysis reaction of the HCDS gas. A film-forming rate may be higher when the silicon (Si) layer containing chlorine (Cl) is formed on the wafer 200 than when the adsorption layer of the HCDS gas is formed on the wafer 200.

When the thickness of the first layer formed on the wafer 200 exceeds a thickness of several atomic layers, a modification action performed in step 2 which will be described below does not have an effect on the first layer. The first layer that may be formed on the wafer 200 may have a minimum thickness of less than one atomic layer. Thus, the first layer may be set to have a thickness of less than one atomic layer to several atomic layers. The modification action performed in step 2a (which will be described below) may be relatively increased by controlling the first layer to have a thickness not more than one atomic layer, i.e., a thickness of less than one atomic layer or of one atomic layer, thereby reducing a time required to perform the modification action in step 2. In this case, a time required to form the first layer in step 1a may also decrease. Accordingly, a process time per cycle may decrease and a process time to perform a total of cycles may thus decrease. That is, a film-forming rate may increase. Also, the controllability of the uniformity of the thickness of the film may be increased by controlling the first layer to have a thickness of one atomic layer or less.

(Removing of Residual Gas)

After the first layer is formed, the valve 243a is closed to stop the supply of the HCDS gas. Then, the HCDS gas (that does not react or that contributed to the formation of the first layer) remaining in the process chamber 201 is removed from the process chamber 201 by alternately performing, a predetermined number of times, a process of exhausting the inside of the process chamber 201 to depressurize the inside of the process chamber 201 (hereinafter referred to as a vacuuming step) and a process of purging the inside of the process chamber 201 with $N_2$ gas as an inert gas (hereinafter referred to as a purging step). Also, in step 1, when the residual gas is removed, the vacuuming step and the purging step may be alternately performed once or a plurality of times, only the vacuuming step may be performed without performing the purging step, or only the purging step may be performed without performing the vacuuming step. Here, a case in which the vacuuming step and the purging step are alternately performed once will be described. An order and process conditions in which the vacuuming step and the purging step are performed will be described in detail with respect to step 2 below.

As a source gas, an inorganic source gas such as tetrachlorosilane, i.e., silicon tetrachloride ($SiCl_4$, abbreviated as STC) gas, trichlorosilane ($SiHCl_3$, abbreviated as TCS) gas, dichlorosilane ($SiH_2Cl_2$, abbreviated as DCS) gas, or monochlorosilane ($SiH_3Cl$, abbreviated as MCS) gas, may be used in addition to the HCDS gas. As the inert gas, a rare gas, such as Ar gas, He gas, Ne gas, Xe gas, etc., may be used in addition to $N_2$ gas.

[Step 2] (Supply of $NH_3$ Gas)

After step 1 ends, $NH_3$ gas activated by heat or plasma is supplied onto the wafer 200 in the process chamber 201.

When the $NH_3$ gas activated by heat is supplied, the valves 243b and 243g to 243j are controlled to be opened/closed in an order similar to the order in which the opening/closing of the valves 243a and 243g to 243j is controlled in step 1. The supply flow rate of the $NH_3$ gas is controlled by the MFC 241b to range, for example, from 100 sccm to 10,000 sccm. An inner pressure of the process chamber 201 is set to range, for example, from 1 Pa to 4,000 Pa, and preferably, from 1 Pa to 3,000 Pa. A partial pressure of the $NH_3$ gas in the process chamber 201 is set to range, for example, from 0.01 Pa to 3,960 Pa. By setting the inner pressure of the process chamber 201 to be relatively high as described above, the $NH_3$ gas may be thermally activated without using plasma. When the $NH_3$ gas is activated by heat and supplied, a relatively soft reaction may occur to relatively softly perform a nitriding action which will be described below. A duration for which the $NH_3$ gas activated by heat is supplied onto the wafer 200, i.e., a gas supply time (irradiation time), is set to range, for example, from 1 to 120 seconds, and preferably, 1 to 60 seconds. The other process conditions are set to be substantially the same as those in step 1 described above.

When the $NH_3$ gas activated by plasma is supplied, the valves 243b and 243g to 243j are controlled to be opened/closed in an order similar to the order in which the opening/closing of the valves 243a and 243g to 243j is controlled in step 1. The supply flow rate of the $NH_3$ gas is controlled by the MFC 241b to range, for example, from 100 sccm to 10,000 sccm. The intensity of high-frequency power supplied between the rod-shaped electrodes 269 and 270 is set to range, for example, from 50 W to 1,000 W. An inner pressure of the process chamber 201 is set to range, for example, from 1 Pa to 100 Pa. A partial pressure of the $NH_3$ gas in the process chamber 201 is set to range, for example, from 0.01 Pa to 100 Pa. By using plasma, the $NH_3$ gas may be activated even when the inner pressure of the process chamber 201 is relatively low as described above. A duration for which active species obtained by exciting the $NH_3$ gas by plasma are supplied onto the wafer 200, i.e., a gas supply time (irradiation time) is set to range, for example, from 1 to 120 seconds, and preferably, from 1 to 60 seconds. The other process conditions are set to be substantially the same as those in step 1 described above.

When the $NH_3$ gas is supplied onto the wafer 200 under the above conditions, at least a portion of the first layer formed on the wafer 200 is nitrided (modified). When the first layer is modified, a second layer containing silicon (Si) and nitrogen (N), i.e., a SiN layer, is formed on the wafer 200. When the second layer is formed, the impurities such as chlorine (Cl) contained in the first layer form a gaseous material containing at least chlorine (Cl) and are then discharged from the process chamber 201 during the modification reaction of the first layer, caused by the $NH_3$ gas. That is, the impurities, such as chlorine (Cl), etc., contained in the first layer are drawn out or eliminated from the first layer to be separated from the first layer. Thus, the concentration of impurities in the second layer is lower than that in the first layer.

(Removing of Residual Gas Using Cycle Purging)

After the second layer is formed, the valve 243b is closed to stop the supply of the $NH_3$ gas. Also, when the $NH_3$ gas is activated by plasma and supplied, the supplying of the high-frequency power between the rod-shaped electrodes 269 and 270 is stopped. Then, a process of exhausting the inside of the process chamber 201 to depressurize the inside of the process chamber 201 (vacuuming step) and a process of purging the inside of the process chamber 201 with $N_2$ gas as an inert gas (purging step) are alternately and repeatedly performed to eliminate the $NH_3$ gas, etc. (that does not react or that contributed to the formation of the first layer) remaining in the process chamber 201 from the process chamber 201. In the present disclosure, that the vacuuming step and the purging step are alternately and repeatedly performed, i.e., performed a plurality of times, may be also referred to as cycle purging or cyclic purging.

In the vacuuming step, the inside of the process chamber 201 is exhausted by the vacuum pump 246 (which may be also referred to as depressurized exhausting or vacuum exhausting) while the supply of the $N_2$ gas into the process chamber 201 is stopped. That is, the inside of the process chamber 201 is exhausted by opening the APC valve 244 while the valves 243g to 243j are closed. The vacuum exhausting performed as described above may be also referred to as vacuum suctioning. In this case, the APC valve 244 is preferably in a full open state, i.e., the APC valve 244 is preferably fully open. A duration for which the vacuuming step is performed is set to range, for example, from 1 to 120 seconds, and preferably, 1 to 60 seconds. Also, that the supply of the $N_2$ gas into the process chamber 201 is stopped should be understood as including not only a state in which the supply of the $N_2$ gas into the process chamber 201 is completely stopped but also a state in which the $N_2$ gas is supplied into the process chamber 201 at a small supply flow rate. That is, that the valves 243g to 243j are closed should be understood as including not only a state in which all these valves are completely closed but also a state in which at least one among these valves is not completely closed and is slightly open.

In the purging step, the inside of the process chamber 201 is exhausted by the vacuum pump 246 while the $N_2$ gas is supplied into the process chamber 201. That is, the inside of the process chamber 201 is exhausted by opening the APC valve 244 while at least one among the valves 243g to 243j and preferably all the valves 243g to 243j are open. The $N_2$ gas acts as a purge gas. In this case, the supply flow rates of the $N_2$ gas are controlled by the respective MFCs 241g to 241j to range, for example, from 100 sccm to 10,000 sccm. The APC valve 244 may be fully opened or the degree of openness of the APC valve 244 may be feedback-controlled so that the inner pressure of the process chamber 201 is maintained constant. A duration for which the purging step is performed is set to range, for example, from 1 to 120 seconds, and preferably, from 1 to 60 seconds.

When the vacuuming step and the purging step are alternately and repeatedly performed, the inner pressure of the process chamber 201 repeatedly changes. Thus, the $NH_3$ gas and the like attached to inner walls of the process chamber 201 or a surface of the wafer 200 may be efficiently removed from the inside of the process chamber 201. Cycle purging is preferably continuously performed, for example, until the residual $NH_3$ gas attached to the surface of the wafer 200 is separated and eliminated from the surface of the wafer 200. However, in order to avoid a decrease in productivity when the SiN film is formed, for example, cycle purging is preferably stopped when the $NH_3$ gas is sufficiently removed from the surface of the wafer 200 in order to not react with the HCDS gas during the supply of the HCDS gas, in step 1 of a next cycle. number of times the vacuuming step and the purging step are alternately and repeatedly performed (hereinafter referred to as number of times of performing cycle purging) is greater than the number of times the vacuuming step and the purging step are alternately performed during the removing of the residual gas in step 1, e.g., two to thirty times, preferably three to sixteen times, and more preferably four to eight times.

As the nitrogen-containing gas, instead of the $NH_3$ gas, for example, a hydrogen nitride gas such as diazene ($N_2H_2$) gas, hydrazine ($N_2H_4$) gas or gas containing compounds thereof may be used. As the inert gas, instead of the $N_2$ gas, a rare gas such as Ar gas, He gas, Ne gas, or Xe gas may be used.

(Performing a Cycle a Predetermined Number of Times)

A SiN film may be formed on the wafer 200 at a predetermined ratio and to a predetermined film thickness by a cycle of non-simultaneously performing steps 1 and 2 described above at least once (a predetermined number of times), i.e., alternately performing steps 1 and 2. The above cycle is preferably performed a plurality of times. That is, a thickness of the SiN layer to be formed per cycle may be set to be less than a desired thickness, and the cycle may be performed a plurality of times until the SiN layer has the desired thickness.

When the cycle is performed a plurality of times, 'a specific gas being supplied onto the wafer 200' in each step after the cycle is performed at least twice' means that the specific gas is supplied on a layer formed on the wafer 200, i.e., on the uppermost surface of the wafer 200 as a stacked structure. 'A specific layer being formed on the wafer 200' means that the specific layer is formed on a layer formed on the wafer 200, i.e., on the uppermost surface of the wafer 200 as a stacked structure. This has been described above, and also applies to modified examples and other embodiments which will be described below.

(Purging and Atmospheric Pressure Recovery)

The valves 243g to 243j are opened to supply $N_2$ gas into the process chamber 201 via the gas supply pipes 232g to 232j and then the $N_2$ gas is exhausted from the exhaust pipe 231. The $N_2$ gas acts as a purge gas to purge the inside of the process chamber 201, thereby eliminating any gas or by-products remaining in the process chamber 201 from the process chamber 201 (purging). Thereafter, an atmosphere in the process chamber 201 is replaced with an inert gas (inert gas replacement), and the inner pressure of the process chamber 201 is restored to normal pressure (atmospheric pressure recovery).

(Boat Unloading and Wafer Discharging)

The seal cap 219 is moved downward by the boat elevator 115 to open the lower end of the reaction tube 203. Then the processed wafers 200 are unloaded to the outside of the reaction tube 203 from the lower end of the reaction tube 203 while being supported by the boat 217 (boat unloading). The processed wafers 200 are unloaded from the boat 217 (wafer discharging).

(3) EFFECTS OF THE PRESENT EMBODIMENT

According to the present embodiment, one or more of the following effects can be achieved.

(a) In step 2, after the supply of the $NH_3$ gas is stopped, cycle purging of alternately and repeatedly performing the vacuuming step and the purging step may be performed to improve the uniformity of the thickness of the film of the SiN film formed on the wafer 200 within a plane of the wafer 200.

That is, in step 2, a hydrogen nitride-based gas such as $NH_3$ gas, i.e., a nitrogen-containing gas (nitriding gas) supplied into the process chamber 201 is likely to remain by being attached to the inner walls of the process chamber 201 (the reaction tube 203), the surface of the wafer 200, etc., compared to HCDS gas. The amount of the $NH_3$ gas remaining on the surface of the wafer 200 may be non-uniform within the plane of the wafer 200, caused by the shape or density (degree of fineness) of a concavo-convex pattern formed on the surface of the wafer 200. For example, when a fine circuit pattern is formed on the surface of the wafer 200 which is a base of a film to be formed and a surface area of a part of the fine circuit pattern locally increases, the NH$_3$ gas is likely to remain while being attached to the surface area of the part of the fine circuit pattern. The NH$_3$ gas remaining on the surface of the wafer 200 may react with HCDS gas supplied onto the wafer 200 in step 1 of a subsequent cycle. The reaction of the NH$_3$ gas with the HCDS gas occurs non-uniformly, i.e., locally, on the surface of the wafer 200 according to the amount of the residual NH$_3$ gas. Thus, the uniformity of the thickness of the film of the SiN film formed on the wafer 200 within the plane of the wafer 200 may decrease. Such a unique problem occurring when a hydrogen nitride-based gas such as NH$_3$ gas, i.e., a nitrogen-containing gas (nitriding gas), is used as a reactive gas as described above has first visibly arisen through inventors' research among recent advancements in fine manufacturing processes.

According to the present embodiment, the residual hydrogen nitride-based gas such as the NH$_3$ gas attached to the inner walls of the process chamber 201, the surface of the wafer 200, etc. may be efficiently removed from the inside of the process chamber 201 by performing cycle purging as described above. As a result, before the HCDS gas is supplied onto the wafer 200 in step 1, the NH$_3$ gas may be prevented from locally remaining on the surface of the wafer 200. Thus, the uniformity of the thickness of the film of the SiN film formed on the wafer 200 within the plane of the wafer 200 may be improved. A change in the inner pressure of the process chamber 201 is considered as a one of reasons why the efficiency of removing the NH$_3$ gas is improved as described above. That is, when the vacuuming step and the purging step are alternately and repeatedly performed, the inner pressure of the process chamber 201 changes and the pressure change is considered as promoting separation of the NH$_3$ gas from the inner walls of the process chamber 201, the surface of the wafer 200, etc.

(b) Since the supply flow rate of N$_2$ gas in the purging step in step 2 is set to be greater (higher) than that in the purging step in step 1, the uniformity of the thickness of the film of the SiN film formed on the wafer 200 within the plane of the wafer 200 can be greatly improved. Furthermore, when the degree of openness of the APC valve 244 in the purging step in step 2 is smaller (less) than that in the purging step in step 1, the uniformity of the thickness of the film of the SiN film formed on the wafer 200 within the plane of the wafer 200 can be more improved. Also, when the degree of openness of the APC valve 244 in the purging step in step 2 is smaller (less) than that in the vacuuming step in step 2, the uniformity of the thickness of the film of the SiN film formed on the wafer 200 within the plane of the wafer 200 can be more improved.

That is, the NH$_3$ gas may be more efficiently removed from the inner walls of the process chamber 201 or the surface of the wafer 200 when the inner pressure of the process chamber 201 sharply changes while the NH$_3$ gas is removed. That is, the greater a change in the inner pressure of the process chamber 201 per unit time, the more efficiently the NH$_3$ gas can be removed from the surface of the wafer 200, etc.

In the present embodiment, a change in the inner pressure of the process chamber 201 per unit time may be increased by setting the supply flow rate of the N$_2$ gas or the degree of openness of the APC valve 244 in the purging step in step 2 as described above. For example, a change in the inner pressure of the process chamber 201 per unit time when a residual gas is removed in step 2 may be controlled to be greater than when a residual gas is removed in step 1. Thus, since the efficiency of removing the NH$_3$ gas from the inner walls of the process chamber 201 or the surface of the wafer 200 can be increased, the uniformity of the thickness of the film of the SiN film formed on the wafer 200 within the plane of the wafer 200 can be more improved.

(c) The uniformity of the thickness of the film of the SiN film formed on the wafer 200 within the plane of the wafer 200 can be more improved by setting number of times the vacuuming step and the purging step are alternately and repeatedly performed in step 2 to be greater (higher) than number of times the vacuuming step and the purging step are alternately and repeatedly performed in step 1.

That is, the greater number of times the inner pressure of the process chamber 201 changes when the NH$_3$ gas is removed, the more efficiently the NH$_3$ gas may be removed from the inner walls of the process chamber 201 or the surface of the wafer 200. That is, the greater number of times the vacuuming step and the purging step are alternately and repeatedly performed in step 2, the more efficiently the NH$_3$ gas may be removed from the inner walls of the process chamber 201 or the surface of the wafer 200.

In the present embodiment, the efficiency of removing the NH$_3$ gas from the inner walls of the process chamber 201 or the surface of the wafer 200 can be more improved by setting number of times the vacuuming step and the purging step are alternately and repeatedly performed in step 2 as described above. For example, when the vacuuming step and the purging step are alternately performed once in step 1 and are alternately and repeatedly performed a plurality of times in step 2, the efficiency of removing the NH$_3$ gas from the inner walls of the process chamber 201 or the surface of the wafer 200 can be more improved. Accordingly, the uniformity of the thickness of the film of the SiN film formed on the wafer 200 within the plane of the wafer 200 can be more improved. Also, since the number of times the vacuuming step and the purging step are performed in step 1 can be reduced (controlled to be small) and a process time per cycle can be reduced, a cycle rate can be improved and thus the productivity of a film forming process can be improved.

When process orders and conditions in which the purging step and the vacuuming step are performed are set as described above, the efficiency of removing (or purging) the NH$_3$ gas, etc. from the inside of the process chamber in step 2 can be controlled to be higher than the efficiency of removing (or purging) the HCDS gas, etc. from the inside of the process chamber 201 in step 1.

(d) Since a source gas having high absorbability such as HCDS gas is used, the SiN film can be efficiently formed and a film forming rate of the SiN film can be increased. Also, the consumption of the HCDS gas that does not contribute to the forming of the SiN film can be reduced to reduce film forming costs.

(e) Since a source gas containing two silicon (Si) atoms per molecule such as HCDS gas is used, silicon (Si) contained in the SiN film to be finally formed are arranged to be adjacent to each other. That is, when a first layer is formed under conditions in which the HCDS gas is not self-decomposed (pyrolyzed), two silicon (Si) atoms contained in each of the molecules of the HCDS gas are adsorbed onto the wafer 200 (an underlying film formed on a surface of the wafer 200) to be adjacent to each other. Also, when a first layer is formed under conditions in which the HCDS gas is self-decomposed (pyrolyzed), the two silicon (Si) atoms contained in each of the molecules of the HCDS gas are likely to be deposited on the wafer 200 to be adjacent to each other. That is, when a gas containing two silicon (Si) atoms per molecule, such as the HCDS gas, is used, silicon (Si)

atoms are likely to be arranged adjacent to each other in the first layer, compared to when a gas containing only one silicon (Si) atom per molecule such as dichlorosilane ($SiH_2Cl_2$, abbreviated as DCS) gas is used. As a result, the SiN film may be formed such that silicon (Si) atoms are arranged adjacent to each other. Accordingly, a hydrofluoride (HF)-resistance property of the SiN film can be improved.

(f) Since various gases are non-simultaneously, i.e., alternately, supplied, they can be appropriately reacted under conditions that cause a surface reaction to be dominant. Thus, the step coverage of and the controllability of the film thickness of the SiN film can be enhanced. Also, excessive gaseous reactions can be avoided in the process chamber 201, thereby suppressing particles from being generated.

(4) MODIFIED EXAMPLES

The film-forming sequence according to the present embodiment is, however, not limited to that illustrated in FIG. 4, and may be embodied in various different forms, for example, modified examples below.

Modified Example 1

A step of supplying $O_2$ gas may be performed at the timing illustrated in FIG. 5A. That is, step 3 of supplying $O_2$ gas activated by heat or plasma to a SiN layer formed using HCDS gas and $NH_3$ gas may be performed.

When the $O_2$ gas activated by heat is supplied in step 3, the valves 243e and 243g to 243j are controlled to be opened or closed in an order similar to the order in which the valves 243a and 243g to 243j are controlled to be opened or closed in step 1. The supply flow rate of the $O_2$ gas controlled by the MFC 241e is set to range, for example, from 100 sccm to 10,000 sccm. An inner pressure of the process chamber 201 is set to range, for example, from 1 Pa to 4,000 Pa, and preferably, from 1 Pa to 3,000 Pa. A partial pressure of the $O_2$ gas in the process chamber 201 is set to range, for example, from 0.01 Pa to 3,960 Pa. By setting the inner pressure of the process chamber 201 to be relatively high as described above, the $O_2$ gas may be thermally activated without using plasma. When the $O_2$ gas is activated by heat and supplied, a relatively soft reaction may occur to perform an oxidizing action relatively softly. A duration for which the $O_2$ gas activated by heat is supplied onto the wafer 200, e.g., a gas supply time (irradiation time) is set to range, for example, from 1 to 120 seconds, and preferably, from 1 to 60 seconds. The other conditions are set to be the same as, for example, those in step 1 described above.

When the $O_2$ gas activated by plasma is supplied in step 3, the valves 243e and 243g to 243j are controlled to be opened or closed in an order similar to the order in which the valves 243a and 243g to 243j are controlled to be opened or closed in step 1. The supply flow rate of the $O_2$ gas controlled by the MFC 241e is set to range, for example, from 100 sccm to 10,000 sccm. The intensity of high-frequency power supplied between the rod-shaped electrodes 269 and 270 is set to range, for example, from 50 W to 1,000 W. An inner pressure of the process chamber 201 is set to range, for example, from 1 Pa to 100 Pa. A partial pressure of the $O_2$ gas in the process chamber 201 is set to range, for example, from 0.01 Pa to 100 Pa. Since plasma is used, the $O_2$ gas may be activated even when the inner pressure of the process chamber 201 is set to be relatively low as described above. A duration for which active species obtained by activating the $O_2$ gas by plasma is supplied onto the wafer 200, e.g., a gas supply time (irradiation time) is set to range, for example, from 1 to 120 seconds, and preferably, from 1 to 60 seconds. The other conditions are set to be the same as those in step 1 described above.

When the $O_2$ gas is supplied onto the wafer 200 under the above conditions, at least a portion of a second layer (SiN layer) formed on the wafer 200 is oxidized (modified). When the SiN layer is modified, a layer containing silicon (Si), oxygen (O) and nitrogen (N), i.e., a SiON layer, is formed on the wafer 200. When the SiON layer is formed, impurities such as chlorine (Cl) contained in the SiN layer form a gaseous material containing at least chlorine (Cl) during a modification reaction of the SiN layer using the $O_2$ gas and is then discharged from the process chamber 201. That is, the impurities such as chlorine (Cl) contained in the SiN layer are drawn out or separated from the SiN layer to be removed from the SiN layer. Thus, the concentration of impurities in the SiON layer is lower than that in the SiN layer.

After the SiON layer is formed, the valve 243e is closed to stop the supply of the $O_2$ gas. When the $O_2$ gas activated by plasma is supplied, the supply of the high-frequency power between the rod-shaped electrodes 269 and 270 is stopped. Then, the $O_2$ gas that does not react or that contributed to the formation of the SiON layer or by-products, which remain in the process chamber 201, are eliminated from the inside of the process chamber 201 in a process order similar to the process order in step 1.

As the oxygen-containing gas, for example, nitrous oxide ($N_2O$) gas, nitrogen monoxide (NO) gas, nitrogen dioxide ($NO_2$) gas, ozone ($O_3$) gas, a combination of hydrogen ($H_2$) gas and oxygen ($O_2$) gas, a combination of $H_2$ gas and $O_3$ gas, water vapor ($H_2O$) gas, carbon monoxide (CO) gas, carbon dioxide ($CO_2$) gas, etc. may be used in addition to the $O_2$ gas.

Then, a cycle of non-simultaneously performing steps 1 to 3 described above may be performed at least once (a predetermined number of times) to form a SiON film containing silicon (Si), oxygen (O) and nitrogen (N) on the wafer 200 at a predetermined composition ratio and to a predetermined thickness. In this case, a thickness of the SiON layer to be formed per cycle may be set to be less than a desired thickness and the cycle may be performed a plurality of times until the SiN layer has the desired thickness, similar to the film-forming sequence illustrated in FIG. 4.

According to the present modified example, the above effects of the film-forming sequence illustrated in FIG. 4 can be also achieved. Also, since more impurities such as chlorine (Cl) are separated from the SiN layer by supplying the $O_2$ gas, the concentration of impurities in the SiON layer to be finally formed may be more decreased, thereby greatly enhancing an HF-resistance property of a layer.

Modified Example 2

Figure 5B:
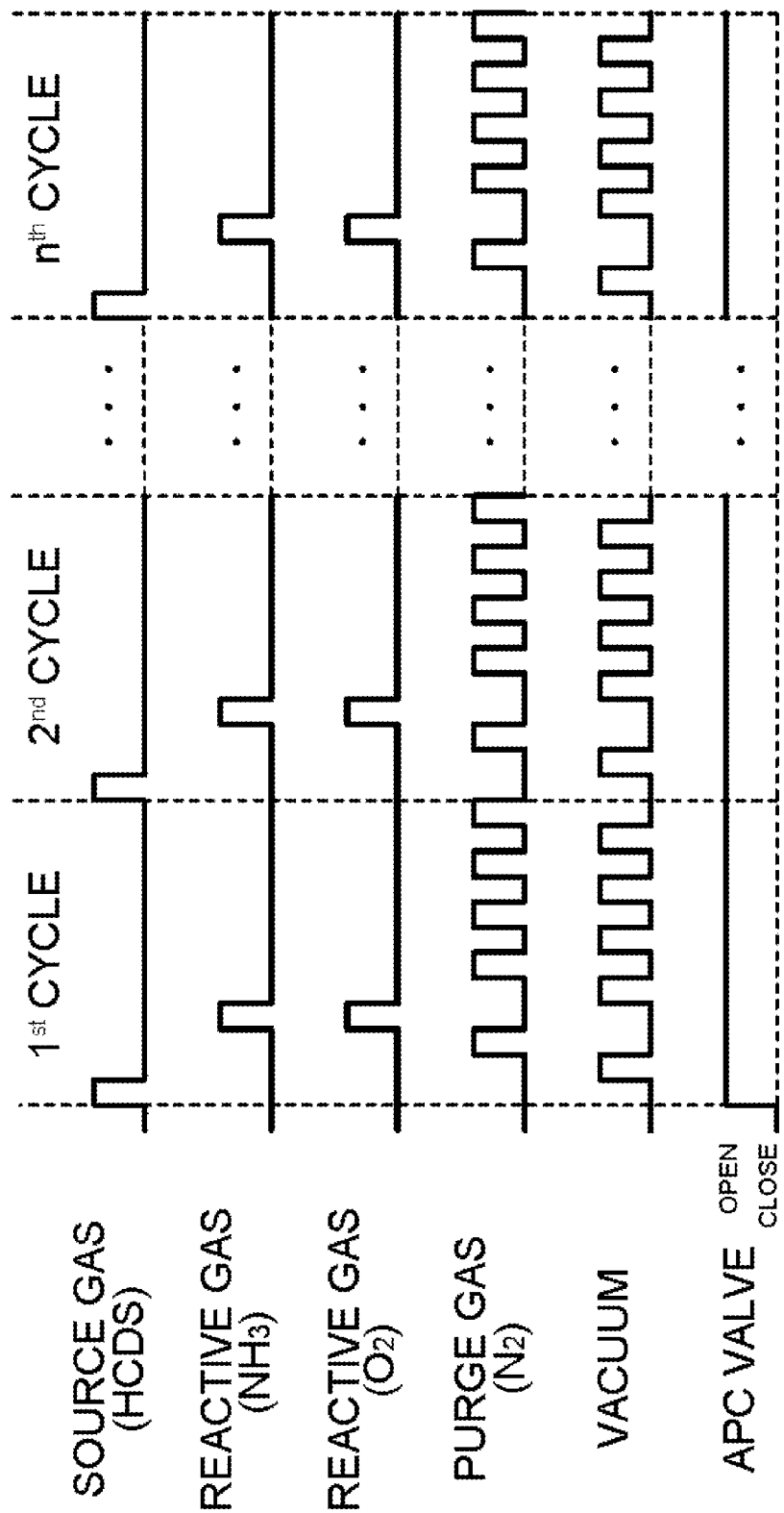

A step of supplying $O_2$ gas may be performed at the timing illustrated in FIG. 5B. That is, supply of $NH_3$ gas and supply of the $O_2$ gas may be synchronized with each other. That is, the $NH_3$ gas and the $O_2$ gas may be supplied simultaneously. Also, removing of the $NH_3$ gas and removing of the $O_2$ gas may be synchronized with each other. In the present modified example, the step of supplying the $O_2$ gas may be performed in process orders and conditions similar to those of the step of supplying the $O_2$ gas in modified example 1.

According to the present modified example, the effects of the above film-forming sequence of FIG. 4 or modified example 1 of FIG. 5A can be achieved. Also, since the supply of the NH$_3$ gas and the supply of the O$_2$ gas are synchronized with each other, a process time per cycle may be reduced, thereby reducing a total process time, compared to modified example 1 in which the supply of the NH$_3$ gas and the supply of the O$_2$ gas are not synchronized with each other. Also, since the removing of the NH$_3$ gas and the removing of the O$_2$ gas are synchronized with each other, the O$_2$ gas may be efficiently removed from the inside of the process chamber 201, compared to modified example 1 in which the removing of the NH$_3$ gas and the removing of the O$_2$ gas are not synchronized with each other. Accordingly, a gaseous reaction of the HCDS gas may be suppressed when the HCDS gas is supplied in a subsequent cycle, and particles may be suppressed from being generated in the process chamber 201.

Modified Example 3

A step of supplying C$_3$H$_6$ gas may be performed at the timing illustrated in FIG. 6. That is, the step of supplying the C$_3$H$_6$ gas may be performed after step 1 of supplying HCDS gas and before step 2 of supplying NH$_3$ gas.

In the step of supplying the C$_3$H$_6$ gas, for example, the valves 243c and 243g to 243j are controlled to be opened or closed in an order similar to the order in which the valves 243a and 243g to 243j are controlled to be opened or closed in step 1. The supply flow rate of the C$_3$H$_6$ gas controlled by the MFC 241c is set to be, for example within a range of 100 sccm to 10,000 sccm. An inner pressure of the process chamber 201 is set to be, for example within a range of 1 Pa to 5,000 Pa, and preferably, 1 Pa to 4,000 Pa. A partial pressure of the C$_3$H$_6$ gas in the process chamber 201 is set to be, for example within a range of 0.01 to 4,950 Pa. A duration for which the C$_3$H$_6$ gas is supplied onto the wafer 200, i.e., a gas supply time (irradiation time), is set to range, for example, from 1 to 200 seconds, preferably, 1 to 120 seconds, and more preferably, 1 to 60 seconds. The other conditions are set to be the same as, for example, those in step 1 described above.

When the step of supplying the C$_3$H$_6$ gas onto the wafer 200 is performed under the above conditions, a carbon (C)-containing layer of a thickness less than one atomic layer, i.e., a discontinuous carbon (C)-containing layer, is formed on a surface of a first layer (a silicon (Si)-containing layer containing chlorine (Cl)) formed on the wafer 200. The carbon (C)-containing layer may be a carbon (C) layer or a chemical adsorption layer of the C$_3$H$_6$ gas, or include both.

After the carbon (C)-containing layer is formed on the first layer, the valve 243c is closed to stop the supply of the C$_3$H$_6$ gas. Then the C$_3$H$_6$ gas that does not react or that contributed to the formation of the first layer or by-products, which remain in the process chamber 201, are removed from the inside of the process chamber 201 in a process order similar to that in step 1.

As the carbon-containing gas, for example, a hydrocarbon-based gas such as acetylene (C$_2$H$_2$) gas, ethylene (C$_2$H$_4$) gas, etc. may be used in addition to the C$_3$H$_6$ gas.

Then a step of supplying NH$_3$ gas onto the wafer 200 is performed to modify the first layer on which the carbon (C)-containing layer is formed into a SiCN layer. To ensure a reaction between the first layer on which the carbon (C)-containing layer is formed and the NH$_3$ gas, i.e., the formation of the SiCN layer, the step of supplying the C$_3$H$_6$ gas is preferably ended before an adsorption reaction of the molecules of the C$_3$H$_6$ gas saturates a surface of the first layer, i.e., before the carbon (C)-containing layer such as an adsorption layer (chemical adsorption layer) of the C$_3$H$_6$ gas formed on the surface of the first layer changes into a continuous layer (while the carbon (C)-containing layer is a discontinuous layer).

Then, a cycle of non-simultaneously performing the above three steps may be performed at least once (a predetermined number of times) to form a SiCN film, as a layer containing silicon (Si), carbon (C) and nitrogen (N), on the wafer 200 at a predetermined composition ratio and to a predetermined thickness. A thickness of the SiCN layer to be formed per cycle may be set to be less than a desired thickness, and the above cycle may be performed a plurality of times until the SiCN layer has the desired thickness, similar to the film-forming sequence of FIG. 4.

According to the present modified example, the effects of the film-forming sequence of FIG. 4 can be achieved. Also, according to the present modified example, when a gas that does not contain nitrogen (N) such as the C$_3$H$_6$ gas, i.e., a hydrocarbon-based gas that does not act as a nitrogen (N) source, is used as the carbon-containing gas to form the SiCN film, a nitrogen (N) component may be prevented from being added to the SiCN film. Thus, in the SiCN film to be finally formed, the concentration of carbon (C) can be increased while suppressing an increase in the concentration of nitrogen (N). That is, the controllability of a composition ratio of the SiCN film can be enhanced.

Modified Examples 4 and 5

Figure 7:
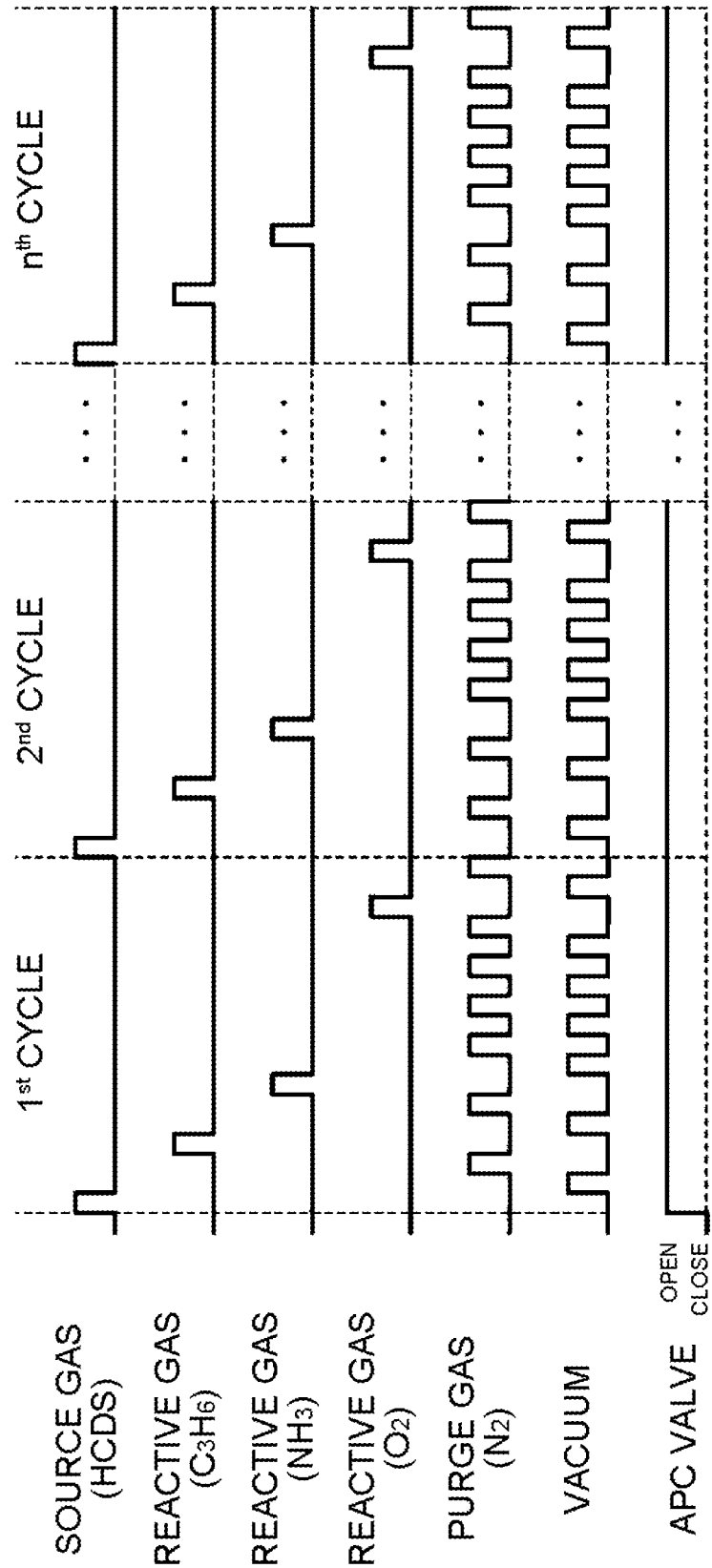
FIG. 7 illustrates a fourth modified example of gas supply timing diagram of a film-forming sequence according to an embodiment of the present invention.

A step of supplying HCDS gas, a step of supplying C$_3$H$_6$ gas, a step of supplying NH$_3$ gas and a step of supplying O$_2$ gas may be performed at the timing illustrated in FIG. 7. That is, a cycle of non-simultaneously performing these four steps may be performed at least once (a predetermined number of times) to form a SiOCN film, as a layer containing silicon (Si), oxygen (O), carbon (C) and nitrogen (N), on the wafer 200 at a predetermined composition ratio and to a predetermined thickness (modified example 4).

Figure 8:
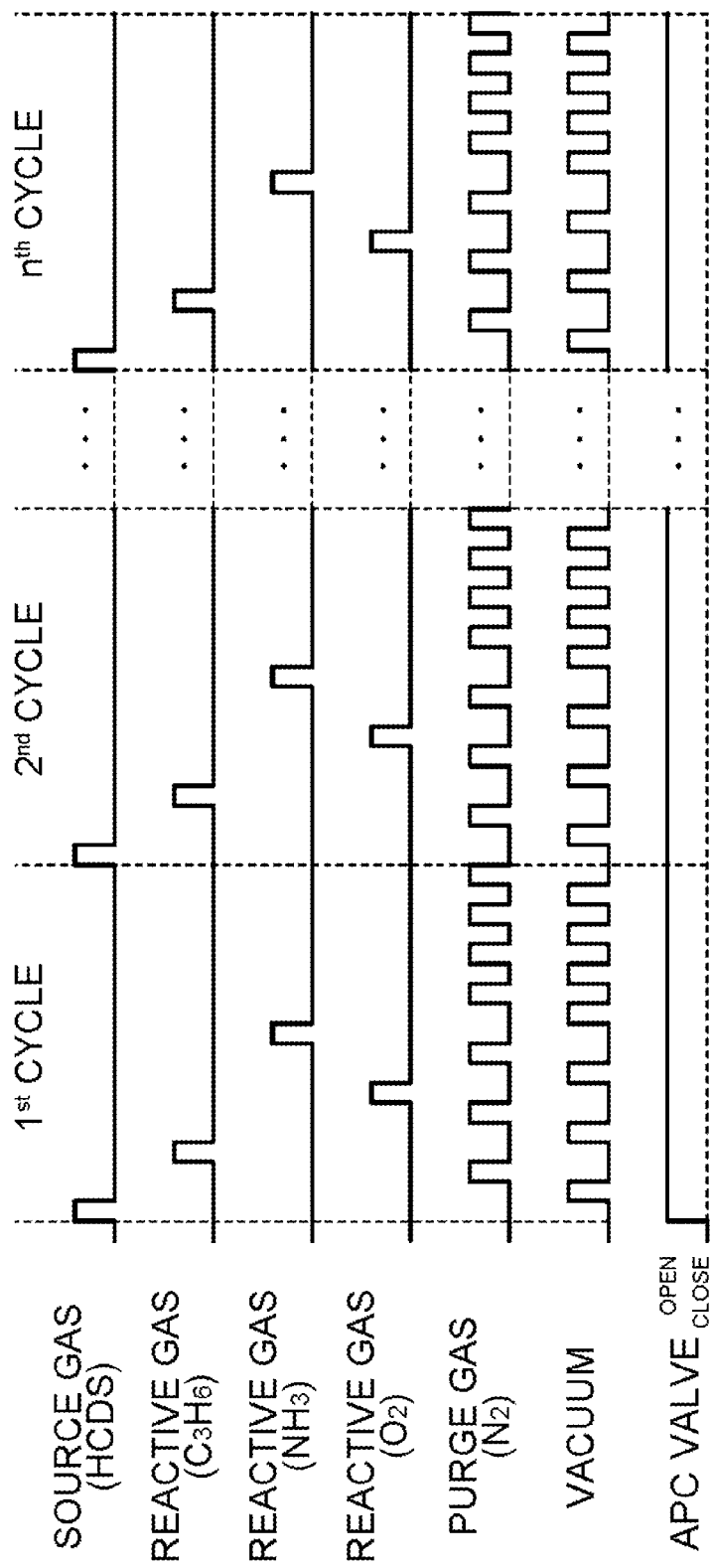
FIG. 8 illustrates a fifth modified example of gas supply timing diagram of a film-forming sequence according to an embodiment of the present invention.

Also, a step of supplying HCDS gas, a step of supplying C$_3$H$_6$ gas, a step of supplying O$_2$ gas, and a step of supplying NH$_3$ gas may be performed at the timing illustrated in FIG. 8. That is, a cycle of non-simultaneously performing these four steps may be performed at least once (a predetermined number of times) to form a SiOCN film on the wafer 200 at a predetermined composition ratio and to a predetermined thickness (modified example 5).

In modified examples 4 and 5, process orders and conditions in each of the steps are set to be the same as those in the film-forming sequence of FIG. 4 or modified examples 1 and 3 described above. According to these modified examples, the effects of the film-forming sequence of FIG. 4 and modified examples 1 and 3 can be achieved.

Modified Example 6

A cycle of non-simultaneously performing a step of supplying HCDS gas, a step of supplying C$_3$H$_6$ gas, a step of supplying BCl$_3$ gas and a step of supplying NH$_3$ gas may be performed a predetermined number of times (n times). That is, a boron-containing gas that does not contain a borazine ring skeleton, e.g., BCl$_3$ gas, may be supplied instead of the O$_2$ gas in modified example 5 illustrated in FIG. 8. In the present modified example, process orders and conditions in the step of supplying the HCDS gas, the step of supplying the C$_3$H$_6$ gas and the step of supplying the NH$_3$ gas are set to be the same as those in the film-forming sequence of FIG. 4 or modified example 3 described above.

In the step of supplying the $BCl_3$ gas, the valves 243d and 243g to 243j are controlled to be opened or closed in an order similar to the order in which the valves 243a and 243g to 243j are controlled to be opened or closed in step 1 described above. The supply flow rate of the $BCl_3$ gas controlled by the MFC 241d is set to range, for example, from 100 sccm to 10,000 sccm. An inner pressure of the process chamber 201 is set to range, for example, from 1 Pa to 2,666 Pa, and preferably, from 67 Pa to 1,333 Pa. A partial pressure of the $BCl_3$ gas in the process chamber 201 is set to range, for example, from 0.01 Pa to 2,640 Pa. A duration for which the $BCl_3$ gas is supplied onto the wafer 200, i.e., a gas supply time (irradiation time), is set to range, for example, from 1 to 120 seconds, and preferably, 1 to 60 seconds. The other conditions are set to be the same as those in step 1 described above.

When the $BCl_3$ gas is supplied onto the wafer 200 under the above conditions, a boron (B)-containing layer of a thickness less than one atomic layer, i.e., a discontinuous boron (B)-containing layer, is formed on a surface of a first layer on which a carbon (C)-containing layer is formed. The boron (B)-containing layer may be a boron (B) layer or a chemical adsorption layer of the $BCl_3$ gas, or include both. When the boron (B)-containing layer is formed on the surface of the first layer on which the carbon (C)-containing layer is formed, a layer containing silicon (Si), boron (B) and carbon (C) is formed on the wafer 200. Since the $BCl_3$ gas is a non-borazine-based boron-containing gas, the layer containing silicon (Si), boron (B) and carbon (C) becomes a layer that does not contain a borazine ring skeleton. When the $BCl_3$ gas is thermally activated without using plasma and supplied, an appropriate reaction may be softly performed and the layer containing silicon (Si), boron (B) and carbon (C) may be easily formed.

As the boron-containing gas that does not contain a borazine ring skeleton, a haloborane-based gas such as a chloroborane-based gas, a fluoroborane-based gas such as trifluoroborane ($BF_3$) gas, or a bromo borane-based gas such as tribromoborane ($BBr_3$) gas, etc. may be used in addition to the $BCl_3$ gas. Also, a borane-based gas such as $B_2H_6$ gas may be used. Also, an organic borane-based gas in addition to an inorganic borane-based gas may be used.

After the layer containing silicon (Si), boron (B) and carbon (C) is formed, the valve 243d is closed to stop the supply of the $BCl_3$ gas. Then, the $BCl_3$ gas that does not react or that contributed to the formation of the layer containing silicon (Si), boron (B) and carbon (C) or by-products, which remain in the process chamber 201, are eliminated from the inside of the process chamber 201 in a process order similar to the process order in step 1.

Then, the step of supplying $NH_3$ gas onto the wafer 200 is performed to modify the layer containing silicon (Si), boron (B) and carbon (C) into a SiBCN layer.

Then, a cycle of non-simultaneously performing the above four steps may be performed at least once (a predetermined number of times) to form a SiBCN film, as a film containing silicon (Si), boron (B), carbon (C) and nitrogen (N), on the wafer 200 at a predetermined composition ratio and to a predetermined thickness. In this case, a thickness of a SiBCN layer to be formed per cycle may be set to be less than a desired thickness and the cycle may be performed a plurality of times until the SiBCN layer has the desired thickness, similar to the film-forming sequence illustrated in FIG. 4.

According to the present modified example, the effects of the above film-forming sequence of FIG. 4 or one of the above modified examples can be achieved. Also, the features of a film, which is to be formed on the wafer 200, may be controlled, e.g., a HF-resistance property of the film may be improved, by adding boron (B) to the film.

Also, in the present modified example, a cycle of sequentially and non-simultaneously performing the step of supplying the HCDS gas, the step of supplying the $C_3H_6$ gas, the step of supplying the $BCl_3$ gas and the step of supplying the $NH_3$ gas may be performed a predetermined number of times (n times). Otherwise, a cycle of sequentially and non-simultaneously performing the step of supplying the HCDS gas, the step of supplying the $BCl_3$ gas, the step of supplying the $C_3H_6$ gas and the step of supplying the $NH_3$ gas may be performed a predetermined number of times (n times). That is, an order in which the step of supplying the $BCl_3$ gas and the step of supplying the $C_3H_6$ gas are performed may be changed. In any case, the above effects can be achieved.

Modified Example 7

A cycle of non-simultaneously performing a step of supplying HCDS gas, a step of supplying $BCl_3$ gas and a step of supplying $NH_3$ gas may be performed a predetermined number of times (n times) to form a SiBN film, as a film containing silicon (Si), boron (B) and nitrogen (N), on the wafer 200 at a predetermined composition ratio and to a predetermined thickness. In the present modified example, process orders and conditions in the steps are set to be the same as those in the film-forming sequence of FIG. 4 or modified example 6 described above. According to the present modified example, the effects of the film-forming sequence of FIG. 4 or modified example 6 described above can be achieved.

Modified Example 8

A cycle of non-simultaneously performing a step of supplying HCDS gas, a step of supplying TMB gas and a step of supplying $NH_3$ gas may be performed a predetermined number of times (n times). That is, a gas containing a borazine ring skeleton such as TMB gas may be supplied instead of $BCl_3$ gas in modified example 7. In the present modified example, process orders and conditions in the step of supplying the HCDS gas and the step of supplying the $NH_3$ gas are set to be the same as those of the film-forming sequence of FIG. 4.

In the step of supplying the TMB gas, the valves 243f and 243g to 243j are controlled to be opened or closed in an order similar to the order in which the valves 243a and 243g to 243j are controlled to be opened or closed in step 1 described above. The supply flow rate of the TMB gas controlled by the MFC 241f is set to range, for example, from 1 sccm to 1,000 sccm. An inner pressure of the process chamber 201 is set to range, for example, from 1 Pa to 2,666 Pa, and preferably, from 67 Pa to 1,333 Pa. A partial pressure of the TMB gas in the process chamber 201 is set to range, for example, from 0.0001 Pa to 2,424 Pa. A duration for which the TMB gas is supplied onto the wafer 200, i.e., a gas supply time (irradiation time), is set to range, for example, from 1 to 120 seconds, and preferably, 1 to 60 seconds. The other process orders and conditions are set to be the same as those in step 1.

When the TMB gas is supplied onto the wafer 200 under the above conditions, a first layer (a silicon (Si)-containing layer containing chlorine (Cl)) and the TMB gas react with each other. That is, chlorine (Cl) (a chlorine group) contained in the first layer and a ligand (a methyl group) contained in the TMB gas react with each other. Thus, the ligand of the TMB gas reacting with chlorine (Cl) of the first layer may be separated from the TMB gas while the chlorine (CL) of the first layer reacting with the ligand in the TMB gas is separated (drawn out) from the first layer. Also, nitrogen (N) forming a borazine ring of the TMB gas from which the ligand is separated may bind with silicon (Si) of the first layer. That is, as metal ligands are removed from boron (B) and nitrogen (N) contained in the borazine ring of the TMB gas, nitrogen (N) including a dangling bond binds with silicon (Si) contained in the first layer and including a dangling bond or silicon (Si) that has included a dangling bond to form a Si—N bond. In this case, a borazine ring skeleton that forms the borazine ring of the TMB gas is not broken and is retained.

By supplying the TMB gas under the above conditions, the first layer and the TMB gas may be appropriately reacted with each other while retaining the borazine ring skeleton in the TMB gas without breaking the borazine ring skeleton in the TMB gas, and a series of reactions as described above may be generated. The most important factors (conditions) that generate the series of reactions while the borazine ring skeleton of the TMB is retained are considered to be the temperature of the wafer 200 and the inner pressure of the process chamber 201 (particularly, the temperature of the wafer 200). An appropriate reaction may be generated by appropriately controlling these factors.

Through the series of reactions, a borazine ring is newly introduced into the first layer, and thus, the first layer includes a borazine ring skeleton and changes (is modified) into a layer containing silicon (Si), boron (B), carbon (C) and nitrogen (N), i.e., a SiBCN layer including a borazine ring skeleton. The SiBCN layer including the borazine ring skeleton has a thickness of, for example, less than one atomic layer to several atomic layers. The SiBCN layer including the borazine ring skeleton may be a layer containing silicon (Si), carbon (C) and a borazine ring skeleton.

When a borazine ring is newly introduced into the first layer, a boron (B) component and a nitrogen (N) component forming a borazine ring are introduced into the first layer. Also, in this case, a carbon (C) component contained in the ligand of the TMB gas is introduced into the first layer. That is, a boron (B) component, a carbon (C) component and a nitrogen (N) component may be added to the first layer by introducing a borazine ring into the first layer by reacting the first layer and the TMB gas with each other.

When the SiBCN layer including a borazine ring skeleton is formed, chlorine (CL) contained in the first layer or hydrogen (H) contained in the TMB gas forms a gas-phase material including at least chlorine (Cl) and hydrogen (H) and is then discharged from the inside of the process chamber 201 during a modification reaction of the first layer due to the TMB gas. That is, impurities such as chlorine (Cl) in the first layer are drawn out or removed from the first layer to be separated from the first layer. Thus, the amount of impurities such as chlorine (Cl) in the SiBCN layer including a borazine ring skeleton is less than that in the first layer.

When a SiBCN layer including a borazine ring skeleton is formed, a central space in the borazine ring may be retained (held) and the SiBCN layer may be formed in a porous shape by retaining the borazine ring skeleton in the TMB gas without breaking the borazine ring skeleton.

After the SiBCN layer including the borazine ring skeleton is formed, the valve 243f is closed to stop the supply of the TMB gas. Then, the TMB gas that does not react or that contributed to the formation of the SiBCN layer including the borazine ring skeleton or by-products, which remain in the process chamber 201, are eliminated from the inside of the process chamber 201 in a process order similar to the process order in step 1.

As a gas including the borazine ring skeleton, for example, TEB gas, TPB gas, TIPB gas, TBB gas, TIBB gas, etc. may be used in addition to the TMB gas.

Then, the step of supplying the $NH_3$ gas onto the wafer 200 is performed to modify the SiBCN layer including the borazine ring skeleton into either an N-rich (or C-poor) SiBCN layer including a borazine ring skeleton or a SiBN layer including a borazine ring skeleton.

Thereafter, a cycle of non-simultaneously performing the above three steps may be performed at least once (a predetermined number of times) to form an N-rich (C-poor) SiBCN film including a borazine ring skeleton or a SiBN film including a borazine ring skeleton on the wafer 200 at a predetermined composition ratio and to a predetermined thickness. A thickness of the SiBCN layer or the SiBN layer to be formed per cycle may be set to be less than a desired thickness, and the cycle may be performed a plurality of times until the SiBCN layer or the SiBN layer has the desired thickness, similar to the film-forming sequence of FIG. 4.

According to the present modified example, the effects of the film-forming sequence of FIG. 4 or one of the above modified examples can be achieved. Also, when a film including a borazine ring skeleton, i.e., a film having a porous shape and a low density of atoms is formed on the wafer 200, a dielectric constant of the film may be reduced to be lower than a dielectric contestant of the SiBCN film or the SiBN film in modified example 6 or 7. Also, when a film including a borazine ring skeleton, i.e., a film including boron (B) as one of components of a borazine ring skeleton forming the film is formed on the wafer 200, an oxidation-resistance property of the film may be enhanced.

Modified Examples 9, 10 and 11

In the film-forming sequence of FIG. 4 or the above modified examples, for example, a siloxane-based source gas such as hexachloro disiloxane ($Si_2Cl_6O$, abbreviated as HCDO) gas, i.e., a gas containing silicon (Si), oxygen (O) and chlorine (Cl) and including a Si—O bond, may be used as a source gas instead of HCDS gas. That is, a gas acting as an oxygen (O) source may be used as a source gas. Here, 'siloxane' generally refers to all compounds having a skeleton of silicon (Si) and oxygen (O) and including a Si—O—Si bond (siloxane bond). Process orders and conditions in which the HCDO gas is supplied are set to be the same as those in step 1 described above. When the HCDO gas is used as a source gas in the film-forming sequence of FIG. 4, a SiON film may be formed on the wafer 200 (modified example 9). When the HCDO gas is used as a source gas in modified example 3 of FIG. 6, a SiOCN film may be formed on the wafer 200 (modified example 10). When the HCDO gas is used as a source gas in modified examples 6, 7 and 8, a SiBCNO film or a SiBNO film may be formed on the wafer 200 (modified example 11). That is, when a gas that also acts as an oxygen (O) source such as the HCDO gas is used as a source gas, a film containing oxygen (O) such as a SiON film, a SiOCN film, a SiBCNO film or a SiBNO film may be formed without additionally performing a step of supplying an oxygen-containing gas such as $O_2$ gas.

Modified Examples 12, 13 and 14

In the film-forming sequence of FIG. 4 or the above modified examples, for example, a gas containing silicon (Si), carbon (C) and chlorine (Cl) and including a SiC bond, such as bis(trichlorosilyl)methane [$(SiCl_3)_2CH_2$, abbreviated as BTCSM] gas, etc., may be used as a source gas instead of HCDS gas. That is, a gas that also acts as a carbon (C) source may be used as the source gas. Process orders and conditions in which the BTCSM gas is supplied are set to be the same as those in step 1 described above. When the BTCSM gas is used as a source gas in the film-forming sequence of FIG. 4, a SiCN film may be formed on the wafer 200 (modified example 12). Also, when the BTCSM gas is used as a source gas in modified example 1 of FIG. 5A, a SiOCN film may be formed on the wafer 200 (modified example 13). When the BTCSM gas is used as a source gas in modified example 7, a SiBCN film may be formed on the wafer 200 (modified example 14). That is, when a gas that also acts as a carbon (C) source such as the BTCSM gas is used as a source gas, a film containing carbon (C) such as a SiCN film, a SiOCN film or a SiBCN film may be formed without performing a step of supplying a carbon-containing gas such as $C_3H_6$ gas.

Other Embodiments of the Present Invention

Various embodiments of the present invention have been described above. However, the present invention is not limited thereto and may be embodied in many different forms without departing from the scope of the invention.

For example, when a residual gas as described above is removed, any one of the vacuuming step and the purging step may be first performed. That is, the vacuuming step may be performed prior to the purging step or the purging step may be performed prior to the vacuuming step. Similarly, when a residual gas is removed using cycle purging, any one of the vacuuming step and the purging step may be first performed. That is, a cycle of performing the vacuuming step prior to the purging step or a cycle of performing the purging step prior to the vacuuming step may be repeatedly performed.

Also, when gases other than $NH_3$ gas, e.g., HCDS gas, $O_2$ gas, $C_3H_6$ gas, $BCl_3$ gas, TMB gas, HCDO gas, BTCSM gas, etc., are removed from the inside of the process chamber 201, gases remaining in the process chamber 201 may not be completely removed and the inside of the process chamber 201 may not be completely purged. For example, only the purging step or the vacuuming step may be performed. When a small amount of gases remains in the process chamber 201 when the gases are removed from the inside of the process chamber 201, a subsequent process will not be negatively influenced by the gases. The flow rate of $N_2$ gas to be supplied into the process chamber 201 in the purging step need not be high. For example, the inside of the process chamber 201 may be purged without causing a subsequent process to be negatively influenced by the gas by supplying an amount of a gas corresponding to the capacity of the reaction tube 203 (or the process chamber 201). When the inside of the process chamber 201 is not completely purged, a purge time may be reduced to improve the throughput. Furthermore, the consumption of the $N_2$ gas may be reduced to a necessary minimum level.

Also, when gases other than $NH_3$ gas, e.g., HCDS gas, $O_2$ gas, $C_3H_6$ gas, $BCl_3$ gas, TMB gas, HCDO gas, BTCSM gas, etc., are removed from the inside of the process chamber 201, cycle purging may be performed by alternately and repeatedly performing the vacuuming step and the purging step, similar to when the $NH_3$ gas is removed from the inside of the process chamber 201. In this case, the gases may be efficiently removed from the inside of the process chamber 201 and particles may be suppressed from being generated in the process chamber 201.

Also, in this case, the supply flow rate of $N_2$ gas in a purging step of a step of supplying a reactive gas ($O_2$ gas, $C_3H_6$ gas, $BCl_3$ gas, TMB gas, etc.) other than $NH_3$ gas is preferably greater (higher) than the supply flow rate of $N_2$ gas in a purging step of step 1 of supplying a source gas (HCDS gas, HCDO gas, BTCSM gas, etc.). Also, in this case, the degree of openness of the APC valve 244 in the purging step included in the step of supplying a reactive gas other than $NH_3$ gas is preferably narrower (less) than the degree of openness of the APC valve 244 in the purging step included in step 1 of supplying a source gas. Also, the degree of openness of the APC valve 244 in the purging step included in the step of supplying a reactive gas other than $NH_3$ gas is preferably narrower (less) than the degree of openness of the APC valve 244 in a vacuuming step included in the step of supplying a reactive gas other than $NH_3$ gas.

That is, a change in the inner pressure of the process chamber 201 per unit time when a residual gas is removed in the step of supplying a reactive gas other than $NH_3$ gas is preferably greater than a change in the inner pressure of the process chamber 201 per unit time when a residual gas is removed in step 1 of supplying a source gas.

Also, in this case, number of times the vacuuming step and the purging step are alternately and repeatedly performed in the step of supplying a reactive gas other than $NH_3$ gas is preferably greater (higher) than number of times the vacuuming step and the purging step are alternately and repeatedly performed in step 1 of supplying a source gas.

Also, in this case, the supply flow rate of $N_2$ gas in a purging step included in step 2 of supplying $NH_3$ gas is preferably greater (higher) than in the purging step included in step 1 of supplying a source gas and in the purging step included in the step of supplying a reactive gas other than $NH_3$ gas.

Also, in this case, a change in the inner pressure of the process chamber 201 per unit time when a residual gas is removed in step 2 of supplying $NH_3$ gas is preferably higher than a change in the inner pressure of the process chamber 201 per unit time when a residual gas is removed in step 1 of supplying a source gas and a change in the inner pressure of the process chamber 201 per unit time when a residual gas is removed in the step of supplying a reactive gas other than $NH_3$ gas.

Also, in this case, number of times the vacuuming step and the purging step are alternately and repeatedly performed in step 2 of supplying $NH_3$ gas is preferably greater (higher) than in step 1 of supplying a source gas and the step of supplying a reactive gas other than $NH_3$ gas.

Cases in which a reactive gas is supplied after a source gas is supplied have been described in the above embodiments. However, the present invention is not limited thereto and the order in which these gases are supplied may be changed. That is, the source gas may be supplied after the reactive gas is supplied. Also, when a plurality of types of reactive gases are used, an order in which they are supplied may be arbitrarily changed. The quality or composition ratio of a film to be formed may be changed by changing the order in which the gases are supplied.

When a silicon-based insulating film formed according to one of the above embodiments and the modified examples is used as a sidewall spacer, a technique of forming a device with low leakage current and high workability is available. Also, when the silicon-based insulating film is used as an etch stopper, a technique of forming a device with high workability is available. According to the above embodiment or some of the modified examples, a silicon-based insulating film may be formed at an ideal stoichiometric ratio without using plasma. Since the silicon-based insulating film can be formed without using plasma, the silicon-based insulating film is applicable to a process in which plasma damage may occur, e.g., a process of forming a SADP film according to a distributed processing technology (DPT), etc.

Cases in which a silicon-based thin film containing silicon (Si) which is a semiconductor element (SiN film, SiON film, SiCN film, SiOCN film, SiBCN film, SiBN film, SiBCNO film, or SiBNO film) is formed as a film containing a specific element have been described in the above embodiments. The present invention is, however, not limited thereto, is applicable to forming, for example, a metal-based thin film including a metal element such as titanium (Ti), zirconium (Zr), hafnium (Hf), tantalum (Ta), niobium (Nb), aluminum (Al), molybdenum (Mo) and tungsten (W).

That is, the present invention is preferably applicable to forming a metal-based thin film, e.g., a TiN film, a TiON film, a TiCN film, a TiOCN film, a TiBCN film, a TiBN film, a TiBCNO film, a TiBNO film, a ZrN film, a ZrON film, a ZrCN film, a ZrOCN film, a ZrBCN film, a ZrBN film, a ZrBCNO film, a ZrBNO film, a HfN film, a HfON film, a HfCN film, a HfOCN film, a HfBCN film, a HfBN film, a HfBCNO film, a HfBNO film, a TaN film, a TaON film, a TaCN film, a TaOCN film, a TaBCN film, a TaBN film, a TaBCNO film, a TaBNO film, a NbN film, a NbON film, a NbCN film, a NbOCN film, a NbBCN film, a NbBN film, a NbBCNO film, a NbBNO film, an AlN film, an AlON film, an AlCN film, an AlOCN film, an AlBCN film, an AlBN film, an AlBCNO film, an AlBNO film, a MoN film, a MoON film, a MoCN film, a MoOCN film, a MoBCN film, a MoBN film, a MoBCNO film, a MoBNO film, a WN film, a WON film, a WCN film, a WOCN film, a WBCN film, a WBN film, a WBCNO film, a WBNO film, etc. In this case, the metal-based thin film may be formed as a source gas containing a metal element instead of a source gas containing silicon (Si) as used in the previous embodiments according to a sequence of one of the above embodiments and the modified example.

When a titanium (Ti)-based thin film is formed, for example, a source gas containing titanium (Ti) and a halogen element may be used as a source gas containing titanium (Ti). As the source gas containing titanium (Ti) and a halogen element, for example, a source gas containing titanium (Ti) and a chloro group such as titanium tetrachloride ($TiCl_4$) or a source gas containing titanium (Ti) and a fluoro group such as titanium tetrafluoride ($TiF_4$) may be used. The type of a reactive gas to be used is as described above in the previous embodiments. In this case, process conditions may be set to be the same as those in the previous embodiments.

When a zirconium (Zr)-based thin film is formed, for example, a source gas containing zirconium (Zr) and a halogen element may be used as a source gas containing zirconium (Zr). As the source gas containing zirconium (Zr) and a halogen element, for example, a source gas containing zirconium (Zr) and a chloro group such as zirconium tetrachloride ($ZrCl_4$) or a source gas containing zirconium (Zr) and a fluoro group such as zirconium tetrafluoride ($ZrF_4$) may be used. The type of a reactive gas to be used is as described above in the previous embodiments. In this case, process conditions may be set to be the same as those in the previous embodiments.

When a hafnium (Hf)-based thin film is formed, for example, a source gas containing hafnium (Hf) and a halogen element may be used as a source gas containing hafnium (Hf). As the source gas containing hafnium (Hf) and a halogen element, for example, a source gas containing hafnium (Hf) and a chloro group such as hafnium tetrachloride ($HfCl_4$) or a source gas containing hafnium (Hf) and a fluoro group such as hafnium tetrafluoride ($HfF_4$) may be used. The type of a reactive gas to be used is as described above in the previous embodiments. In this case, process conditions may be set to be the same as those in the previous embodiments.

When a tantalum (Ta)-based thin film is formed, for example, a source gas containing tantalum (Ta) and a halogen element may be used as a source gas containing tantalum (Ta). As the source gas containing tantalum (Ta) and a halogen element, for example, a source gas containing tantalum (Ta) and a chloro group such as tantalum pentachloride ($TaCl_5$) or a source gas containing tantalum (Ta) and a fluoro group such as tantalum pentafluoride ($TaF_5$) may be used. The type of a reactive gas to be used is as described above in the previous embodiments. In this case, process conditions may be set to be the same as those in the previous embodiments.

When a niobium (Nb)-based thin film is formed, for example, a source gas containing niobium (Nb) and a halogen element may be used as a source gas containing niobium (Nb). As the source gas containing niobium (Nb) and a halogen element, for example, a source gas containing niobium (Nb) and a chloro group such as niobium pentachloride ($NbCl_5$) or a source gas containing niobium (Nb) and a fluoro group such as niobium pentafluoride ($NbF_5$) may be used. The type of a reactive gas to be used is as described above in the previous embodiments. In this case, process conditions may be set to be the same as those in the previous embodiments.

When an aluminum (Al)-based thin film is formed, for example, a source gas containing aluminum (Al) and a halogen element may be used as a source gas containing aluminum (Al). As the source gas containing aluminum (Al) and a halogen element, for example, a source gas containing aluminum (Al) and a chloro group such as aluminum trichloride ($AlCl_3$) or a source gas containing aluminum (Al) and a fluoro group such as aluminum trifluoride ($AlF_3$) may be used. The type of a reactive gas to be used is as described above in the previous embodiments. In this case, process conditions may be set to be the same as those in the previous embodiments.

When a molybdenum (Mo)-based thin film is formed, for example, a source gas containing molybdenum (Mo) and a halogen element may be used as a source gas containing a molybdenum (Mo). As the source gas containing molybdenum (Mo) and a halogen element, for example, a source gas containing molybdenum (Mo) and a chloro group such as molybdenum pentachloride ($MoCl_5$) or a source gas containing molybdenum (Mo) and a fluoro group such as molybdenum pentafluoride ($MoF_5$) may be used. The type of a reactive gas to be used is as described above in the previous embodiments. In this case, process conditions may be set to be the same as those in the previous embodiments.

When a tungsten (W)-based thin film is formed, for example, a source gas containing tungsten (W) and a halogen element may be used as a source gas containing tungsten (W). As the source gas containing tungsten (W) and a halogen element, for example, a source gas containing tungsten (W) and a chloro group such as tungsten hexachloride ($WCl_6$) or a source gas containing tungsten (W) and a fluoro group such as tungsten hexafluoride ($WF_6$) may be used. The type of a reactive gas to be used is as described above in the previous embodiments. In this case, process conditions may be set to be the same as those in the previous embodiments.

That is, the present invention is preferably applicable to forming a thin film containing a specific element such as a semiconductor element, a metal element, etc.

A plurality of process recipes (programs including process orders or conditions) are preferably individually prepared to be used to form various thin films according to the details of substrate processing (the type, composition ratio, quality and thickness of a thin film to be formed), respectively. When substrate processing begins, an appropriate process recipe is preferably selected among the plurality of process recipes according to the details of substrate processing. In detail, the plurality of process recipes individually prepared according to the details of substrate processing are preferably stored (installed) in the memory device 121c included in the substrate processing apparatus beforehand via a telecommunication line or a recording medium (the external memory device 123) storing the process recipes. When substrate processing begins, the CPU 121a included in the substrate processing apparatus, preferably, appropriately selects an appropriate process recipe among the plurality of process recipes stored in the memory device 121c according to the details of substrate processing. Accordingly, various thin films of different types and having different composition ratios, qualities and thicknesses may be formed using one substrate processing apparatus for a general purpose and with high reproducibility. Also, a load on an operator in manipulation (a load on the operator in inputting a process order or conditions, etc.) may be decreased, and substrate processing can rapidly start without errors in operation.

However, the process recipes described above are not limited to those that are newly developed and may be prepared, for example, by changing a process recipe installed in the substrate processing apparatus. When the installed process recipe is changed, the changed process recipe may be installed in the substrate processing apparatus via a telecommunication line or a recording medium storing the changed process recipe. Otherwise, the process recipe installed in the substrate processing apparatus may be directly changed by manipulating the I/O device 122 of the substrate processing apparatus.

In the previous embodiments, cases in which a thin film is formed using a batch-type substrate processing apparatus capable of processing a plurality of substrates at once have been described above. The present invention is, however, not limited thereto and is preferably applicable to a case in which a thin film is formed using a single-wafer substrate processing apparatus capable of processing one or several substrates at a time. Also, in the previous embodiments, cases in which a film is formed using a substrate processing apparatus including a hot wall type process furnace. The present invention is not limited thereto and is preferably applicable to a case in which a thin film is formed using a substrate processing apparatus including a cold wall type process furnace. In this case, process conditions are also set to be the same as those in the previous embodiments.

Figure 14A:
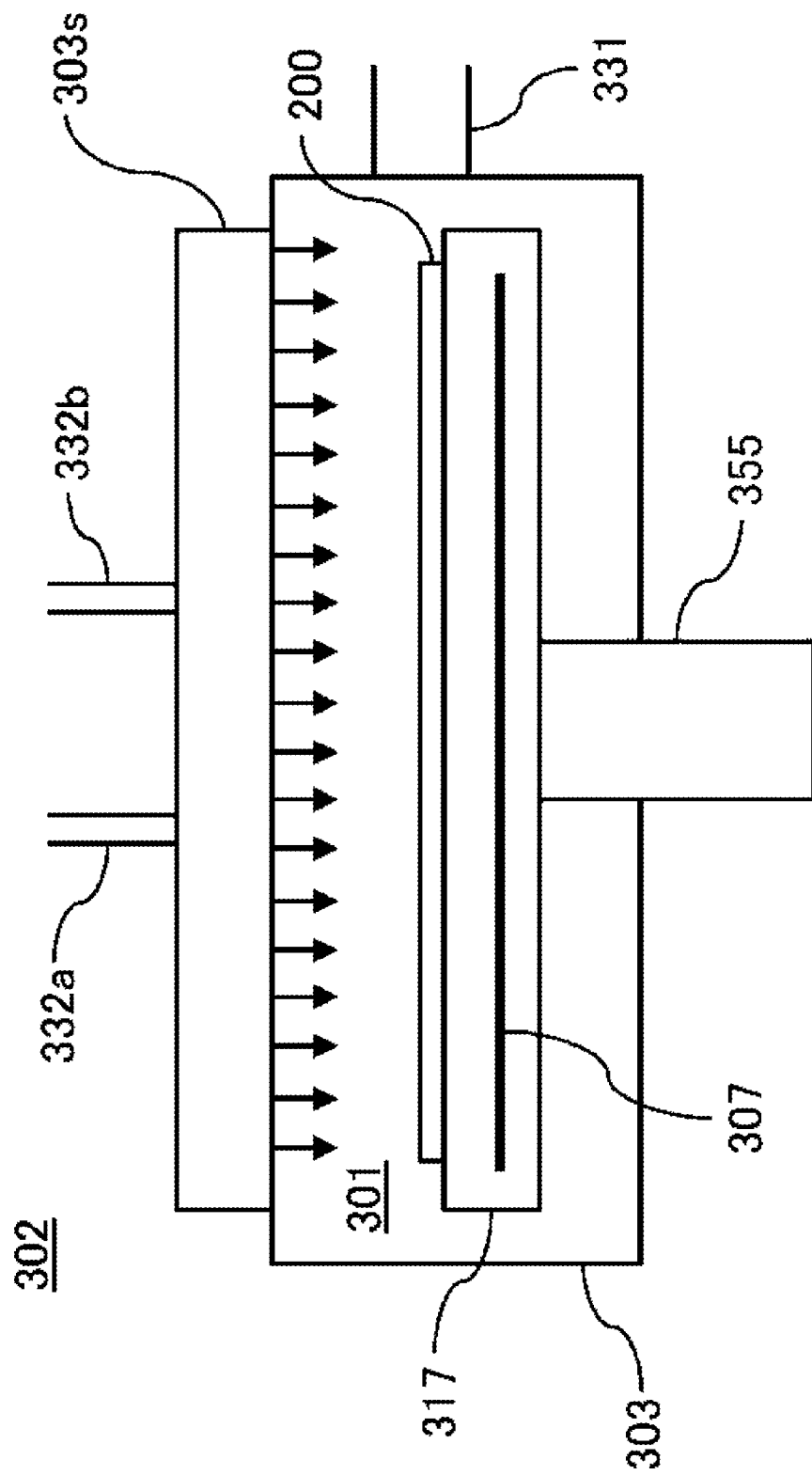
FIGS. 14A and 14B are schematic configuration diagrams of process furnaces of substrate processing apparatuses according to other embodiments of the present invention illustrating vertical cross-sectional views of process furnace portions.

For example, the present invention is preferably applicable to forming a thin film using a substrate processing apparatus including a process furnace 302 illustrated in FIG. 14A. The process furnace 302 includes a process container 303 forming a process chamber 301, a shower head 303s that supplies a gas into the process chamber 301 in the form of a shower, a support table 317 for supporting one or several wafers 200 in a horizontal posture, a rotation axis 355 for supporting the support table 317 from below, and a heater 307 installed in the support table 317. A gas supply pipe 332a that supplies a source gas and a gas supply pipe 332b that supplies a reactive gas are connected to an inlet (a gas introduction hole) of the shower head 303s. A source gas supply system as described above in the previous embodiments is connected to the gas supply pipe 332a. A reactive gas supply system gas as described above in the previous embodiments is connected to the gas supply pipe 332b. A gas dispersion plate that supplies a gas into the process chamber 301 in the form of a shower is connected to an outlet (a gas discharge hole) of the shower head 303s. In the process container 303, an exhaust pipe 331 that exhausts the inside of the process chamber 301 is installed.

Figure 14B:
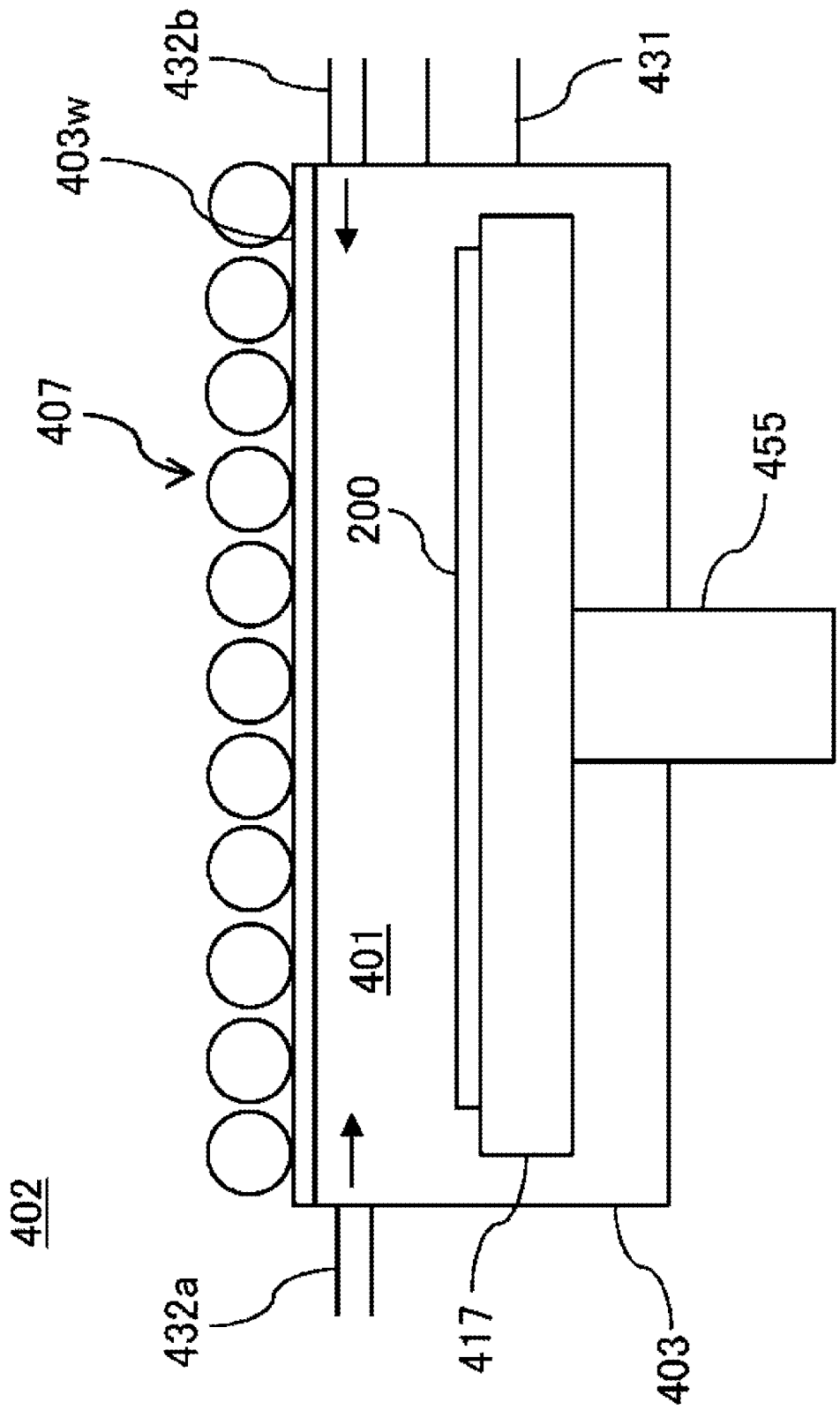

Also, for example, the present invention is preferably applicable to forming a thin film using a substrate processing apparatus including a process furnace 402 illustrated in FIG. 14B. The process furnace 402 includes a process container 403 forming a process chamber 401, a support table 417 that supports one or several wafers 200 in a horizontal posture, a rotation axis 455 that supports the support table 417 from below, a lamp heater 407 that irradiates light toward the wafers 200 in the process container 403, and a quartz window 403w that allows light from the lamp heater 407 to pass therethrough. A gas supply pipe 432a that supplies a source gas and a gas supply pipe 432b that supplies a reactive gas are connected to the process container 403. A source gas supply system as described above in the previous embodiments is connected to the gas supply pipe 432a. A reactive gas supply system gas as described above in the previous embodiments is connected to the gas supply pipe 432b. In the process container 403, an exhaust pipe 431 that exhausts the inside of the process chamber 401 is installed.

When the substrate processing apparatuses described above are used, a film may be formed in a sequence and according to process conditions that are the same as those in the previous embodiments and the modified examples.

The above embodiments, the modified examples, etc. may be used in an appropriate combination. In this case, process conditions may be set to be the same as those of the above embodiments.

EXAMPLES (a) Dependence of the Uniformity of the Thickness of the Film within Plane of Wafer on Surface Area of Wafer First, the relationship between the uniformity of the thickness of the film of a SiN film within a plane of a wafer and a surface area of the wafer was evaluated. Here, samples 1a and 2a were prepared by performing a film-forming sequence of alternately performing, a predetermined number of times, a step of supplying HCDS gas onto the wafer and a step of supplying $NH_3$ gas onto the wafer using the substrate processing apparatus described above. When HCDS gas and the $NH_3$ gas were removed from the inside of a process chamber, the vacuuming step and the purging step were alternately performed once without performing cycle purging. When a SiN film was formed, the wafer was set to have a predetermined temperature that was within a range of 600° C. to 650° C. A fine concavo-convex structure was formed on a surface of the wafer of the sample 2a, and a wafer, the surface area of which is 23 times greater than that of the wafer of the sample 1a was used as the wafer of the sample 2a. The other process orders and conditions were set to be the same as those of the film-forming sequence of FIG. 4. Then, the uniformities of the thickness of the SiN films of the samples 1a and 2a within planes of the wafers were measured.

Figure 9A:
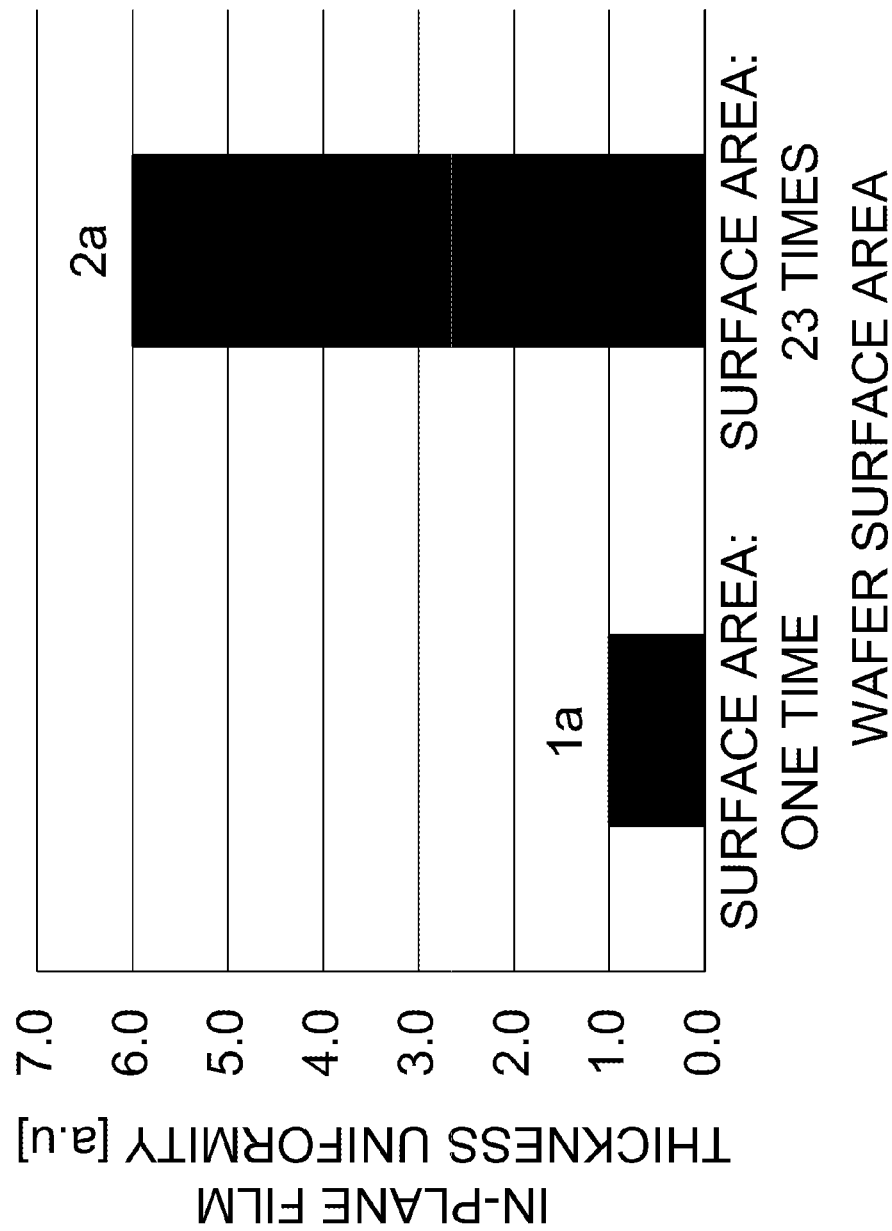
FIG. 9A is a graph depicting the relationship between the uniformity of the thickness of the film of a SiN film within a plane of a wafer and a surface area of the wafer.

FIG. 9A is a graph depicting the relationship between the uniformity of the thickness of the film of a SiN film within a plane of a wafer and a surface area of the wafer. In FIG. 9A, a horizontal axis denotes relative values of the surface areas of the wafers of the samples 1a and 2a, and a vertical axis denotes relative values of the uniformities of the thickness of the SiN films within the planes of the wafers, i.e., relative values of deviations between thicknesses of the SiN films within the planes of the wafers. That is, the vertical axis denotes a relative value of a deviation (%) between thicknesses of the SiN film of the sample 2a within the plane of the wafer when a deviation (%) between thicknesses of the SiN film of the sample 1a within the plane of the wafer is 1.0 (reference value). Here, a deviation (%) between thicknesses of a film within a plane of a wafer is a value defined as (((a maximum thickness of the film within the plane of the wafer−a minimum thickness of the film within the plane of the wafer)/2×an average thickness of the film within the plane of the wafer)×100). The smaller the deviation (%) between the thicknesses of the film within the plane of the wafer, the higher the uniformity of the thickness of the film of the film within the plane of the wafer, i.e., the more uniform the thicknesses of the film within the plane of the wafer. That is, in FIG. 9A, the smaller the values on the vertical axis, the more uniform the thicknesses of the film within the plane of the wafer. This also applies to other embodiments of the present invention.

Referring to FIG. 9A, the uniformity of the thickness of the film of the SiN film of the sample 2a within the plane of the wafer is worse than that of the SiN film of the sample 1a within the plane of the wafer. That is, as the surface area of the wafer which is a base of a film to be formed increases, the uniformity of the thickness of the film of the SiN film within the plane of the wafer degrades. Such a tendency is also shown when HCDS gas and $NH_3$ gas are simultaneously supplied onto a wafer by chemical vapor deposition (CVD).

(b) Dependence of the Uniformity of the Thickness of the Film within Plane of Wafer on Flow Rate of HCDS Gas Next, the relationship between the uniformity of the thickness of the film of a SiN film within a plane of a wafer and the supply flow rate of HCDS gas was evaluated. Here, samples 1b to 3b were prepared by performing a film-forming sequence of alternately performing, a predetermined number of times, a step of supplying HCDS gas onto a wafer and a step of supplying $NH_3$ gas onto the wafer using the substrate processing apparatus described above. When the HCDS gas and the $NH_3$ gas were removed from the inside of a process chamber, the vacuuming step and the purging step were alternately performed once without performing cycle purging. When the samples 1b to 3b were prepared, the supply flow rates of the HCDS gas was set to 60 sccm, 120 sccm and 180 sccm, respectively. The other process conditions were set to be the same as those of the film-forming sequence of FIG. 4. Then, the uniformities of the thickness of the SiN films of the samples 1b to 3b within planes of wafers were measured.

Figure 9B:
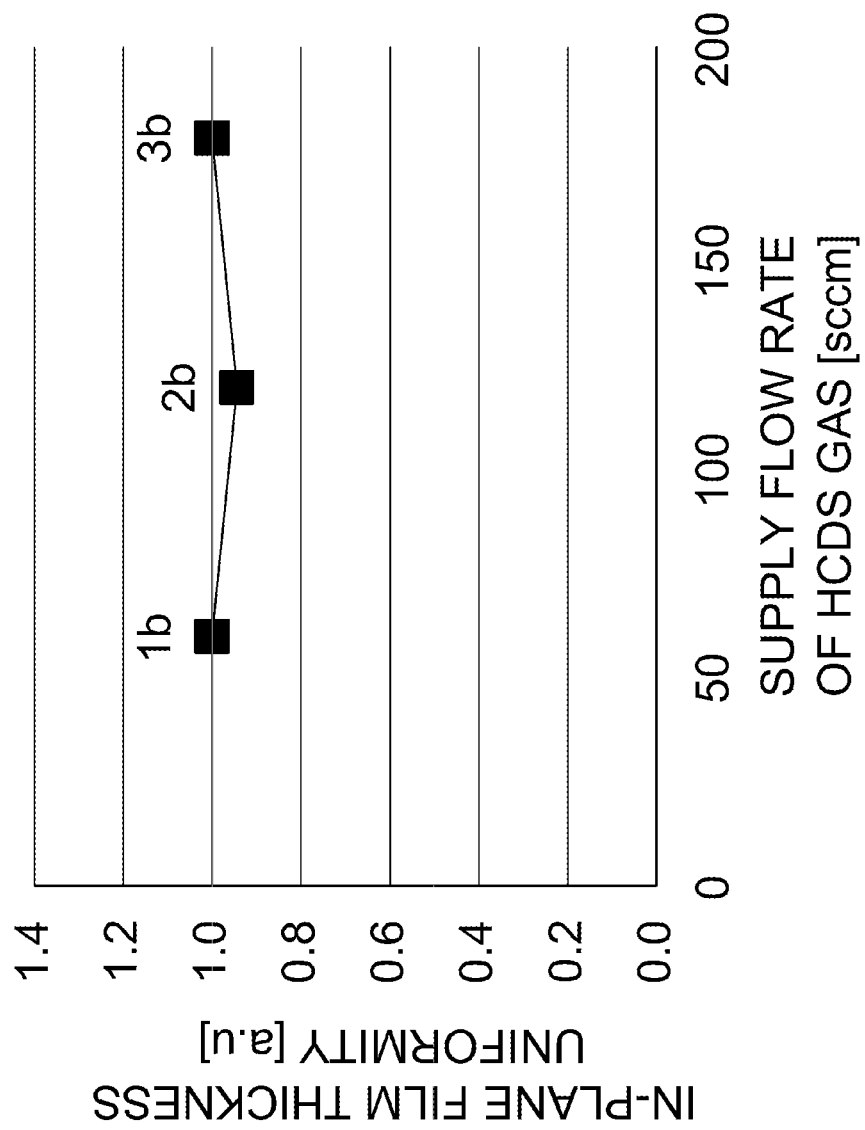
FIG. 9B is a graph depicting the relationship between the uniformity of the thickness of the film of a SiN film within a plane of a wafer and a supply flow rate of HCDS gas.

FIG. 9B is a graph depicting the relationship between the uniformity of the thickness of the film of a SiN film within a plane of a wafer and a supply flow rate of HCDS gas. In FIG. 9B, a horizontal axis denotes the supply flow rate (expressed in sccm) of the HCDS gas, and a vertical axis denotes relative values of the uniformities of the thickness of the SiN films within the planes of the wafers. Here, a deviation between thicknesses of the SiN film of the sample 1b within the plane of the wafer was set to 1.0 (reference value).

Referring to FIG. 9B, the uniformities of the thickness of the SiN films of the samples 1b to 3b within the planes of the wafers were substantially the same. That is, a sufficient supply flow rate of the HCDS gas was about 60 sccm (i.e., 60 sccm was sufficient), and the uniformities of the thickness of the SiN films were not improved even when the supplied amount of the HCDS gas increased.

(c) Dependence of the Uniformity of the Thickness of the Film within Plane of Wafer on Flow Rate of $NH_3$ Gas Next, the relationship between the uniformity of the thickness of the film of a SiN film within a plane of a wafer and the supply flow rate of $NH_3$ gas was evaluated. Here, samples 1c through 3c were prepared by performing a film-forming sequence of alternately performing, a predetermined number of times, a step of supplying HCDS gas onto a wafer and a step of supplying $NH_3$ gas onto the wafer using the substrate processing apparatus described above. When the HCDS gas and the $NH_3$ gas were removed from the inside of a process chamber, the vacuuming step and the purging step were alternately performed once without performing cycle purging. When the samples 1c through 3c were prepared, the supply flow rates of the $NH_3$ gas was set to 800 sccm, 1,600 sccm and 2,000 sccm, respectively. The other process conditions were set to be the same as those of the film-forming sequence of FIG. 4. Then, the uniformities of the thickness of the SiN films of the samples 1c through 3c within planes of wafers were measured.

FIG. 10A is a graph depicting the relationship between the uniformity of the thickness of the film of a SiN film within a plane of a wafer and a supply flow rate of $NH_3$ gas. In FIG. 10A, a horizontal axis denotes the supply flow rate of the $NH_3$ gas (expressed in sccm), and a vertical axis denotes relative values of the uniformities of the thickness of the SiN films within the planes of the wafers. Here, a deviation between thicknesses of the SiN film of the sample 1c within the plane of the wafer was set to 1.0 (reference value).

Referring to FIG. 10A, the uniformities of the thickness of the SiN films within the planes of the wafers decreased in the order of the sample 1c, the sample 2c and the sample 3c (i.e., the uniformity of the thickness of the film of the sample 1c was highest and the uniformity of the thickness of the film of the sample 3c was lowest). That is, as the supply flow rate of the $NH_3$ gas increased, the uniformity of the thickness of the film of the SiN film within the plane of the wafer became lower. This seems to be because the amount of the $NH_3$ gas remaining while being attached to the process chamber or a surface of the wafer increased when the supply flow rate of the $NH_3$ gas increased.

(d) Dependence of the Uniformity of the Thickness of the Film within Plane of Wafer on Method of Removing Residual Gas Next, the relationship between the uniformity of the thickness of the film of a SiN film within a plane of a wafer and a method of removing a residual gas from the inside of a process chamber was evaluated. Here, samples 1d to 3d were prepared by performing a film-forming sequence of alternately performing, a predetermined number of times, a step of supplying HCDS gas onto a wafer and a step of supplying $NH_3$ gas onto the wafer using the substrate processing apparatus described above. When the sample 1d was formed, the HCDS gas and $NH_3$ gas were removed from the inside of a process chamber by performing the vacuuming step once, i.e., without performing the purging step. When the sample 2d was formed, the HCDS gas and $NH_3$ gas were removed from the inside of the process chamber by performing the purging step once, i.e., without performing the vacuuming step. When the sample 2d was formed, the HCDS gas and $NH_3$ gas were removed from the inside of the process chamber by performing cycle purging. The other process orders and conditions were set to be the same as those of the film-forming sequence of FIG. 4. Then, the uniformities of the thickness of the SiN films of the samples 1d to 3d within planes of wafers were measured.

Figure 10B:
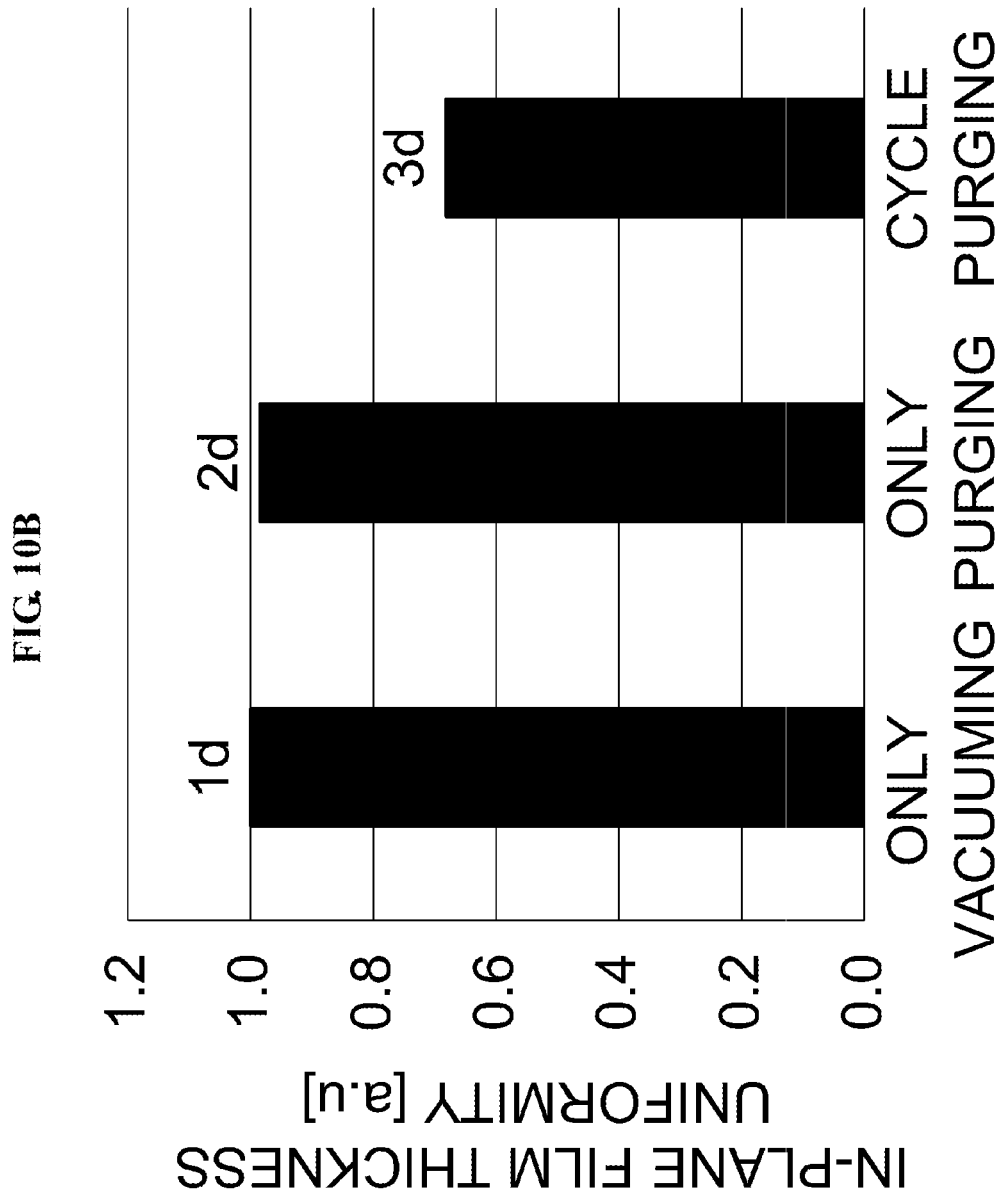
FIG. 10B is a graph depicting the relationship between the uniformity of the thickness of the film of a SiN film within a plane of a wafer and a method of removing $NH_3$ gas.

FIG. 10B is a graph depicting the relationship between the uniformity of the thickness of the film of a SiN film within a plane of a wafer and a method of removing a residual gas (HDS gas or $NH_3$ gas). In FIG. 10B, a horizontal axis denotes the samples 1d to sample 3d, i.e., methods of removing the residual gas with respect to the samples 1d to 3d, and a vertical axis denotes relative values of the uniformities of the thickness of the SiN films within planes of wafers. Here, a deviation between thicknesses of the sample 1d within the plane of the wafer was set to 1.0 (reference value).

Referring to FIG. 10B, the uniformity of the thickness of the film of the SiN film of the sample 3d within the plane of the wafer was better than those of the samples 1d and 2d within the planes of the wafers. That is, by performing cycle purging, a gas remaining on a surface of the wafer, etc. may be efficiently removed, and thus the uniformity of the thickness of the film of the SiN film within the plane of the wafer may be improved.

(e) Dependence of the Uniformity of the Thickness of the Film within Plane of Wafer on Flow Rate of $N_2$ Gas when Residual Gas is Removed Next, the relationship between the uniformity of the thickness of the film of a SiN film within a plane of a wafer and the flow rate of $N_2$ gas when a residual gas was removed was evaluated. Here, samples 1e to 3e were prepared by performing a film-forming sequence of alternately performing, a predetermined number of times, a step of supplying HCDS gas onto a wafer and a step of supplying $NH_3$ gas onto the wafer using the substrate processing apparatus described above. When the samples 1e to 3e were prepared, HCDS gas and $NH_3$ gas were removed from the inside of a process chamber by performing cycle purging, and the supply flow rate of $N_2$ gas was set to 1.5 slm, 6 slm and 12 slm, respectively, in the purging step when the HCDS gas and the $NH_3$ gas were removed. The other process orders and conditions were set to be the same as those of the film-forming sequence of FIG. 4. Then, the uniformities of the thickness of the SiN films of the samples 1e to 3e within planes of wafers were measured.

FIG. 11A is a graph depicting the relationship between the uniformity of the thickness of the film of a SiN film within a plane of a wafer and a supply flow rate of $N_2$ in a purging step when a residual gas (the HCDS gas and the $NH_3$ gas) is removed. In FIG. 11A, a horizontal axis denotes the supply flow rate of $N_2$ gas (expressed in slm) in the purging step when the residual gas was removed, and a vertical axis denotes relative values of the uniformities of the thickness of the SiN films within planes of wafers. Here, a deviation between thicknesses of the SiN film of the sample 1e within the plane of the wafer was set to 1.0 (reference value).

Referring to FIG. 11A, the uniformities of the thickness of the SiN films within the planes of the wafers increased in the order of the samples 1e, 2e and 3e (i.e., the uniformity of the thickness of the film of the sample 1e was lowest and the uniformity of the thickness of the film of the sample 3e was highest). That is, the uniformity of the thickness of the film of the SiN film within the plane of the wafer increased by increasing the supply flow rate of $N_2$ gas in the purging step when the residual gas was removed. That is, a gas remaining on a surface of the wafer, etc. may be more efficiently removed by increasing the supply flow rate of $N_2$ gas in the purging step when cycle purging was performed. This seems to be because a change in the inner pressure of the process chamber per unit time increased when the supply flow rate of $N_2$ gas in the purging step increased.

(f) Dependence of the Uniformity of the Thickness of the Film within Plane of Wafer on Number of Times Cycle Purging is Repeatedly Performed Next, the relationship between the uniformity of the thickness of the film of a SiN film within a plane of a wafer and number of times the vacuuming step and the purging step are alternately and repeatedly performed (a number of times cycle purging is repeatedly performed) when a residual gas is removed was evaluated. Here, samples 1f to 6f were prepared by performing a film-forming sequence of alternately performing, a predetermined number of times, a step of supplying HCDS gas onto a wafer and a step of supplying $NH_3$ gas onto the wafer using the substrate processing apparatus described above. When the sample 1f was prepared, HCDS gas and $NH_3$ gas were removed from the inside of a process chamber by alternately performing the vacuuming step and the purging step once without performing cycle purging. When the samples 2f to 6f were prepared, HCDS gas and $NH_3$ gas were removed from the inside of the process chamber by performing cycle purging, and number of times the vacuuming step and the purging step were alternately and repeatedly performed were set to twice, three times, four times, eight times and sixteen times with respect to the samples 2f to 6f, respectively. The other process conditions were set to be the same as those of the film-forming sequence of FIG. 4. Then, the uniformities of the thickness of the SiN films of the samples 1f to 6f within planes of wafers were measured.

Figure 11B:
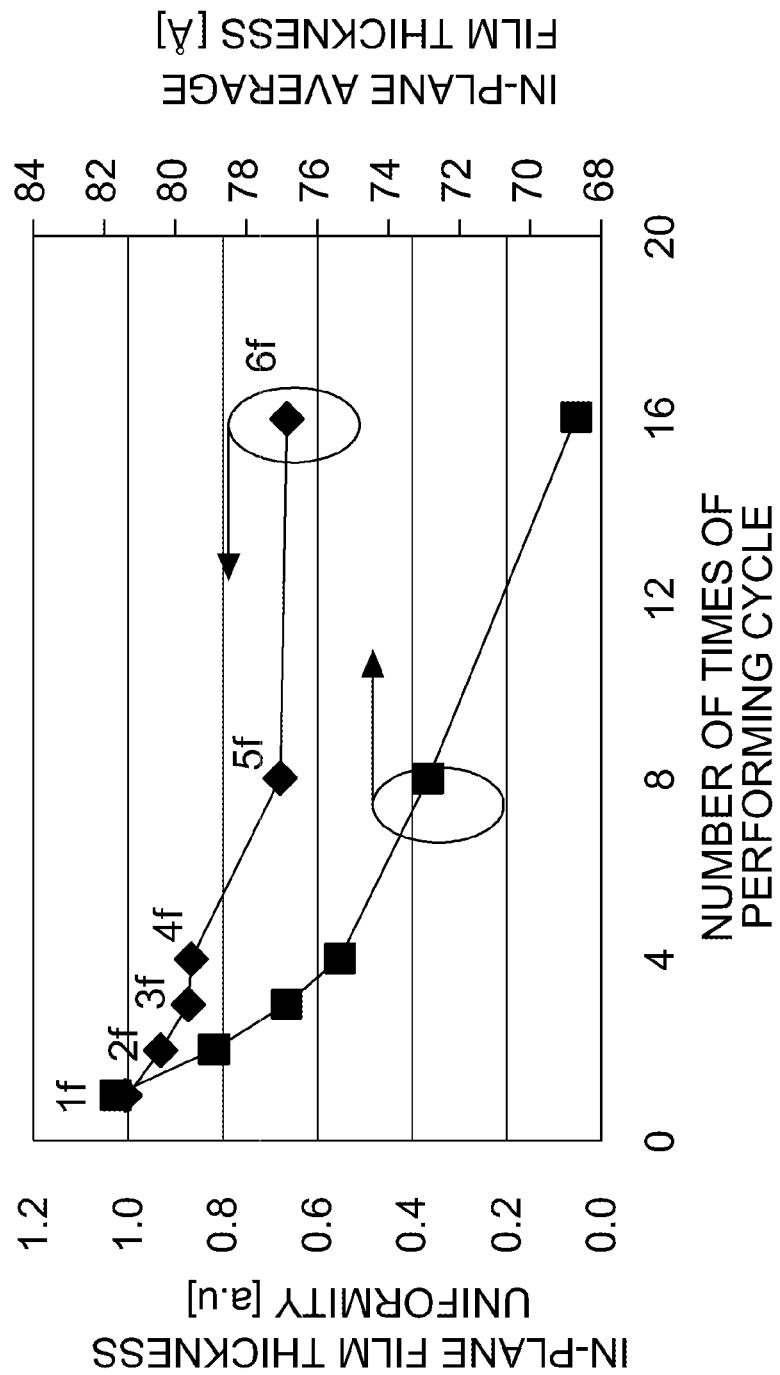
FIG. 11B is a graph depicting the relationship among the uniformity of the thickness of the film of a SiN film within a plane of a wafer, an average film thickness of the SiN film within the plane of the wafer, and number of times a vacuuming step and a purging step are alternately performed when NH3 gas was removed.

FIG. 11B is a graph depicting the relationship among the uniformity of the thickness of the film of a SiN film within a plane of a wafer, an average film thickness of the SiN film within the plane of the wafer, and number of times the vacuuming step and the purging step are alternately and repeatedly performed when a residual gas (HCDS gas and NH3 gas) is removed. In FIG. 11B, a horizontal axis denotes number of times the vacuuming step and the purging step were alternately and repeatedly performed. In FIG. 11B, '1' on a vertical axis denotes that cycle purging was not performed. In FIG. 11B, a left vertical axis denotes a relative value of the uniformity of the thickness of the film of a SiN film of each of the samples 1f to 6f within the plane of the wafer. Here, a deviation between thicknesses of the SiN film of the sample 1f was set to 1.0 (reference value). In FIG. 11B, a right vertical axis denotes average film thicknesses (expressed in) of the respective SiN films within the planes of the wafers.

According to FIG. 11B, the uniformities of the thickness of the SiN films within the planes of the wafers increased in the order of the samples 1f, 2f, 3f, 4f, 5f and 6f (i.e., the uniformity of the thickness of the film of the sample 1f was lowest and the uniformity of the thickness of the film of the sample 6f was highest). That is, when the residual gas was removed from the inside of a process chamber, the residual gas remaining on a surface of the wafer, etc. was more efficiently removed from the surface of the wafer by performing cycle purging and increasing the number of times the vacuuming step and the purging step are alternately and repeatedly performed. Also, according to FIG. 11B, as the number of times the vacuuming step and the purging step are alternately and repeatedly performed increased, an average film thickness of the SiN film formed on the wafer within the plane of the wafer decreased. This seems to be because the amount of the residual $NH_3$ gas attached to the inside of the process chamber, a surface of the wafer, etc. decreased by increasing the number of times the vacuuming step and the purging step are alternately and repeatedly performed when $NH_3$ gas was removed from process chamber.

(g) Dependence of the Uniformity of the Thickness of the Film within Plane of Wafer on Ratio Between Number of Times Cycle Purging is Repeatedly Performed when HCDS Gas is Removed and Number of Times Cycle Purging is Repeatedly Performed when $NH_3$ Gas is Removed Next, the relationship between the uniformity of the thickness of the film of a SiN film within a plane of a wafer and the ratio of number of times cycle purging is repeatedly performed when HCDS gas is removed to number of times cycle purging is repeatedly performed when $NH_3$ gas is removed was evaluated. Here, samples 1g and 2g were prepared by performing a film-forming sequence of alternately performing, a predetermined number of times, a step of supplying HCDS gas onto a wafer and a step of supplying $NH_3$ gas onto the wafer using the substrate processing apparatus described above. When the sample 1g was prepared, the HCDS gas was removed from the inside of a process chamber by alternately and repeatedly performing the vacuuming step and the purging step twice, and the $NH_3$ gas was removed from the inside of the process chamber by alternately and repeatedly performing the vacuuming step and the purging step sixteen times. That is, the ratio of the number of times cycle purging was repeatedly performed when the HCDS gas was removed to the number of times cycle purging was repeatedly performed when the $NH_3$ gas was removed was set to 2/16=1/8. When the sample 2g was prepared, the HCDS gas was removed from the inside of the process chamber by alternately and repeatedly performing the vacuuming step and the purging step sixteen times, and the $NH_3$ gas was removed from the inside of the process chamber by alternately and repeatedly performing the vacuuming step and the purging step sixteen times. That is, the ratio of the number of times cycle purging was repeatedly performed when the HCDS gas was removed to the number of times cycle purging was repeatedly performed when the $NH_3$ gas was removed was set to 16/16=1/1. The other process conditions were set to be the same as those of the film-forming sequence of FIG. 4. Then, the uniformities of the thickness of the SiN films of the samples 1g and 2g within planes of wafers were measured.

Figure 12:
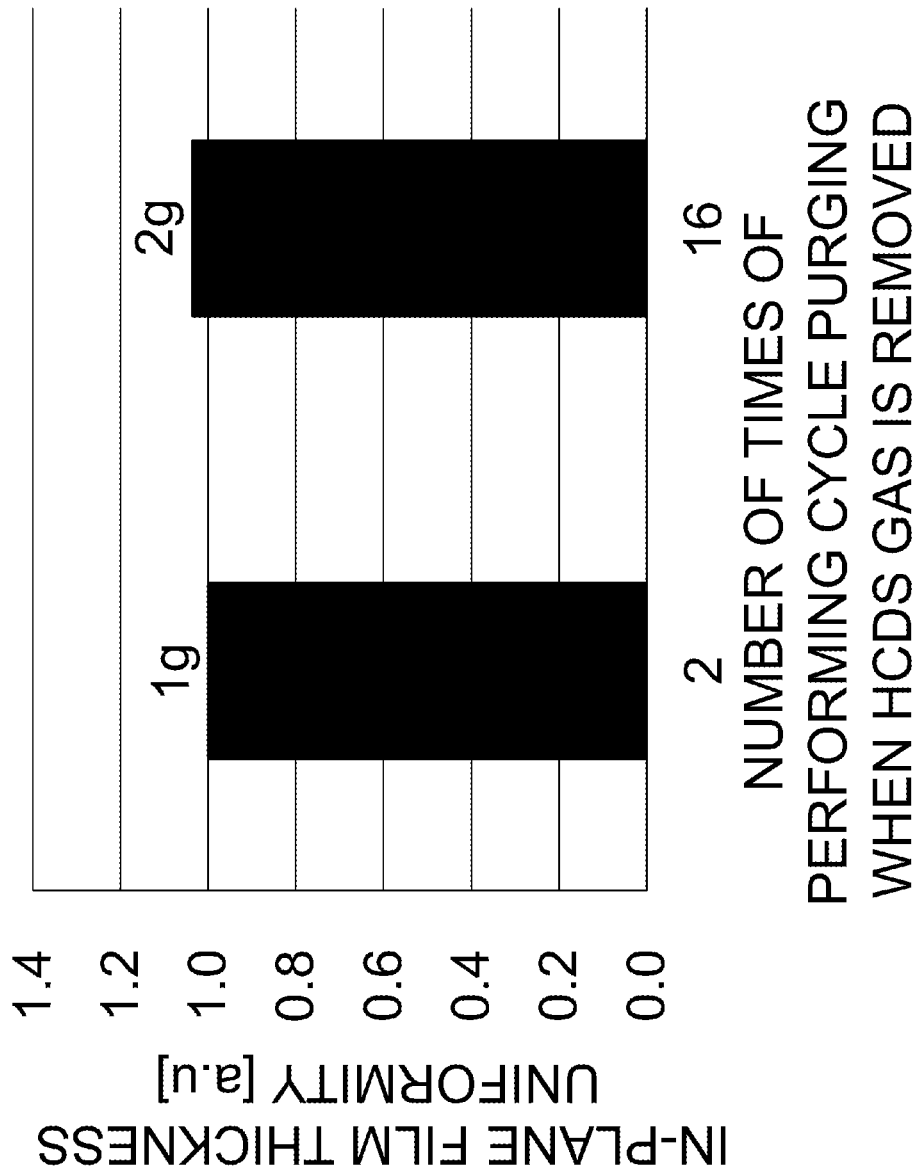
FIG. 12 is a graph depicting the relationship between the uniformity of the thickness of the film of a SiN film within a plane of a wafer, and number of times a vacuuming step and a purging step are alternately performed when HCDS gas was removed.

FIG. 12 is a graph depicting the relationship between the uniformity of the thickness of the film of a SiN film within a plane of a wafer, and number of times the vacuuming step and the purging step are alternately performed when HCDS gas was removed. In FIG. 12, a horizontal axis denotes the number of times the vacuuming step and the purging step were alternately and repeatedly performed when the HCDS gas was removed, and a vertical axis denotes relative values of the SiN films within the planes of the wafers. Here, a deviation between thicknesses of the SiN film of the sample 1g was set to 1.0 (reference value). FIG. 12 may be considered to be a drawing illustrating the relationship between the uniformity of the thickness of the film of the SiN film within the plane of the wafer, and the ratio of the number of times cycle purging was repeatedly performed when the HCDS gas was removed to the number of times cycle purging was repeatedly performed when the $NH_3$ gas was removed.

Referring to FIG. 12, the uniformities of the thickness of the SiN films of the samples 1g and 2g within the planes of the wafers were substantially the same. That is, even when the number of times the vacuuming step and the purging step are alternately and repeatedly performed increased when the HCDS gas was removed, i.e., the ratio of the number of times cycle purging was repeatedly performed when the HCDS gas was removed to the number of times cycle purging was repeatedly performed when the $NH_3$ gas was removed increased, the uniformities of the thickness of the SiN films within the planes of the wafers were not improved. Also, when the $NH_3$ gas was removed by alternately and repeatedly performing the vacuuming step and the purging step sixteen times, the uniformities of the thickness of the SiN films within the planes of the wafers were substantially the same as those of the SiN film of the sample 1g within the plane of the wafer even when the HCDS gas was removed by alternately performing the vacuuming step and the purging step once, performing only the vacuuming step, or performing only the purging step. That is, the uniformities of the thickness of the SiN films within the planes of the wafers were more effectively improved by increasing the number of times the vacuuming step and the purging step are alternately and repeatedly performed when the $NH_3$ gas was removed than when the HCDS gas was removed. As described above, it was revealed that a dominant factor that degrades the uniformity of the thickness of the film of a SiN film within a plane of a wafer is $NH_3$ gas remaining on a surface of the wafer rather than HCDS gas remaining on the surface of the wafer. This is because the $NH_3$ gas has a characteristic of being more likely to remain on the surface of the wafer than the HCDS gas, and characteristic of the $NH_3$ gas will become more conspicuous as a surface area of the wafer increases.

According to the present invention, the uniformity of the thickness of the film of a film to be formed on a substrate within a plane of the substrate may be improved.

Exemplary Embodiments of the Present Invention

Exemplary embodiments of the present invention will be supplementarily described below.
(Supplementary Note 1)
According to one aspect of the present invention, there is provided a substrate processing method and a method of manufacturing a semiconductor device, including: performing a cycle a predetermined number of times to form a film on a substrate, the cycle including non-simultaneously (without synchronization) performing:

(a) supplying a source gas to the substrate in a process chamber;

(b) removing the source gas from the process chamber;

(c) supplying a reactive gas having a chemical structure different from that of the source gas to the substrate in the process chamber; and (d) removing the reactive gas from the process chamber, wherein the (d) includes alternately repeating: (d-1) exhausting an inside of the process chamber to depressurize the inside of the process chamber; and (d-2) purging the inside of the process chamber using an inert gas.

(Supplementary Note 2)

In the method of Supplementary note 1, preferably, the (b) includes alternately performing or repeating, a predetermined number of times: (b-1) exhausting the inside of the process chamber to depressurize the inside of the process chamber; and (b-2) purging the inside of the process chamber using the inert gas.

(Supplementary Note 3)

In the method of Supplementary note 2, preferably, a flow rate of the inert gas supplied in the (d-2) is greater than a flow rate of the inert gas supplied in the (b-2).

(Supplementary Note 4)

In the method of any one of Supplementary notes 2 and 3, preferably, the number of times the (d-1) and (d-2) are repeated in the (d) is greater than the number of times the (b-1) and (b-2) are performed in the (b).

(Supplementary Note 5)

In the method of any one of Supplementary notes 1 to 4, preferably, a deviation of an inner pressure of the process chamber per unit time in the (d) is greater than a deviation of the inner pressure of the process chamber per unit time in the (b).

(Supplementary Note 6)

In the method of any one of Supplementary notes 1 to 5, preferably, the cycle further includes: (e) supplying a second reactive gas having a chemical structure different from those of the source gas and the reactive gas (first reactive gas) onto the substrate in the process chamber; and (f) removing the second reactive gas from the process chamber.

(Supplementary Note 7)

According to another aspect of the present invention, there is provided a substrate processing method and a method of manufacturing a semiconductor device, including: performing a cycle, a predetermined number of times, to form a film on a substrate, the cycle including:

(a) supplying a source gas to the substrate in a process chamber;

(b) removing the source gas from the process chamber;

(c) supplying a first reactive gas having a chemical structure different from that of the source gas to the substrate in the process chamber;

(d) removing the first reactive gas from the process chamber;

(e) supplying a second reactive gas having a chemical structure different from those of the source gas and the first reactive gas to the substrate in the process chamber; and (f) removing the second reactive gas from the process chamber, wherein at least the (a) through (d) are non-simultaneously performed a predetermined number of times, and the (d) includes alternately repeating: (d-1) exhausting an inside of the process chamber to depressurize the inside of the process chamber; and (d-2) purging the inside of the process chamber using an inert gas.

(Supplementary Note 8)

In the method of Supplementary note 7, preferably, the (b) includes alternately performing or repeating, a predetermined number of times: (b-1) exhausting the inside of the process chamber to depressurize the inside of the process chamber; and (b-2) purging the inside of the process chamber using the inert gas, and the (f) includes alternately performing or repeating, a predetermined number of times: (f-1) exhausting the inside of the process chamber to depressurize the inside of the process chamber; and (f-2) purging the inside of the process chamber using the inert gas.

(Supplementary Note 9)

In the method of Supplementary note 8, preferably, a flow rate of the inert gas in the (d-2) is greater than each flow rate of the inert gas in the (b-2) and (f-2).

(Supplementary Note 10)

In the method of any one of Supplementary notes 8 and 9, preferably, the number of times the (d-1) and (d-2) are repeated in the (d) is greater than the number of times the (b-1) and (b-2) are performed in the (b) and the number of times the (f-1) and (f-2) are performed in the (f).

(Supplementary Note 11)

In the method of any one of Supplementary notes 7 to 10, preferably, a deviation of an inner pressure of the process chamber per unit time in the (d) is greater than deviations of the inner pressure of the process chamber per unit time in the (b) and (f).

(Supplementary Note 12)

In the method of any one of Supplementary notes 7 to 11, preferably, the (a), (b), (c), (d), (e) and (f) are performed non-simultaneously.

(Supplementary Note 13)

In the method of any one of Supplementary notes 7 to 11, preferably, the (c) and (e) are performed simultaneously and the (d) and (f) are performed simultaneously.

(Supplementary Note 14)

In the method of any one of Supplementary notes 1 to 13, preferably, the of removing the reactive gas (the first reactive gas) is performed after the of supplying the reactive gas (the first reactive gas) and before the of supplying the source gas.

(Supplementary Note 15)

In the method of any one of Supplementary notes 1 to 14, preferably, the reactive gas (the first reactive gas) includes a nitrogen-containing gas (a nitriding gas).

(Supplementary Note 16)

In the method of any one of Supplementary notes 1 to 15, preferably, the reactive gas (the first reactive gas) includes a hydrogen nitride group gas.

(Supplementary Note 17)

In the method of any one of Supplementary notes 1 to 16, preferably, the reactive gas (the first reactive gas) includes at least one selected from the group consisting of ammonia gas, hydrazine gas and diazene gas.

(Supplementary Note 18)

According to another aspect of the present invention, there is provided a substrate processing apparatus including:

a process chamber configured to accommodate a substrate;

a source gas supply system configured to supply a source gas into the process chamber;

a reactive gas supply system configured to supply a reactive gas having a chemical structure different from that of the source gas into the process chamber;

an inert gas supply system configured to supply an inert gas into the process chamber;

an exhaust system configured to exhaust an inside of the process chamber; and a control unit configured to control the source gas supply system, the reactive gas supply system, the inert gas supply system and the exhaust system to perform a cycle, a predetermined number of times, to form a film on the substrate, the cycle including non-simultaneously performing: (a) supplying the source gas to the substrate in the process chamber; (b) removing the source gas from the process chamber; (c) supplying the reactive gas to the substrate in the process chamber; and (d) removing the reactive gas from the process chamber, wherein (d-1) exhausting the inside of the process chamber to depressurize the inside of the process chamber; and (d-2) purging the inside of the process chamber using the inert gas are alternately repeated in the (d).

(Supplementary Note 19)

According to another aspect of the present invention, there is provided a substrate processing apparatus including:

a process chamber configured to accommodate a substrate;

a source gas supply system configured to supply a source gas into the process chamber;

a first reactive gas supply system configured to supply a first reactive gas having a chemical structure different from that of the source gas into the process chamber;

a second reactive gas supply system configured to supply a second reactive gas having a chemical structure different from those of the source gas and the first reactive gas into the process chamber;

an inert gas supply system configured to supply an inert gas into the process chamber;

an exhaust system configured to exhaust an inside of the process chamber; and a control unit configured to control the source gas supply system, the first reactive gas supply system, the second reactive gas supply system, the inert gas supply system and the exhaust system to perform a cycle, a predetermined number of times, to form a film on the substrate, the cycle including: (a) supplying the source gas to the substrate in the process chamber; (b) removing the source gas from the process chamber; (c) supplying the first reactive gas to the substrate in the process chamber; (d) removing the first reactive gas from the process chamber; (e) supplying the second reactive gas to the substrate in the process chamber; and (f) removing the second reactive gas from the process chamber, wherein at least the (a) through (d) are non-simultaneously performed, and (d-1) exhausting the inside of the process chamber to depressurize the inside of the process chamber; and (d-2) purging the inside of the process chamber using the inert gas are alternately repeated in the (d).

(Supplementary Note 20)

According to another aspect of the present invention, there is provided a program and a non-transitory computer-readable recording medium storing a program for causing a computer to perform a cycle, a predetermined number of times, to form a film on a substrate, the cycle including non-simultaneously performing:

(a) supplying a source gas to the substrate in a process chamber;

(b) removing the source gas from the process chamber;

(c) supplying a reactive gas having a chemical structure different from that of the source gas to the substrate in the process chamber; and (d) removing the reactive gas from the process chamber, wherein the (d) includes alternately repeating: (d-1) exhausting an inside of the process chamber to depressurize the inside of the process chamber; and (d-2) purging the inside of the process chamber using an inert gas.

(Supplementary Note 21)

According to another aspect of the present invention, there is provided a program and a non-transitory computer-readable recording medium storing a program for causing a computer to perform a cycle a predetermined number of times to form a film on a substrate, the cycle including:

(a) supplying a source gas to the substrate in a process chamber;

(b) removing the source gas from the process chamber;

(c) supplying a first reactive gas having a chemical structure different from that of the source gas to the substrate in the process chamber;

(d) removing the first reactive gas from the process chamber;

(e) supplying a second reactive gas having a chemical structure different from those of the source gas and the reactive gas to the substrate in the process chamber; and (f) removing the second reactive gas from the process chamber, wherein at least the (a) through (d) are non-simultaneously performed, and the (d) includes alternately repeating: (d-1) exhausting an inside of the process chamber to depressurize the inside of the process chamber; and (d-2) purging the inside of the process chamber using an inert gas.

What is claimed is:

1. A method of manufacturing a semiconductor device, comprising: performing a cycle a predetermined number of times to form a film on a substrate, the cycle comprising non-simultaneously performing:
   (a) supplying a source gas to the substrate in a process chamber;
   (b) removing the source gas from the process chamber;
   (c) supplying a reactive gas including a hydrogen nitride-based gas to the substrate in the process chamber, the reactive gas having a chemical structure different from that of the source gas; and
   (d) removing the reactive gas from the process chamber, wherein the (b) comprises alternately performing:
      (b-1) exhausting an inside of the process chamber to depressurize the inside of the process chamber; and
      (b-2) purging the inside of the process chamber using an inert gas, wherein the (d) comprises alternately performing:
      (d-1) exhausting the inside of the process chamber to depressurize the inside of the process chamber; and
      (d-2) purging the inside of the process chamber using the inert gas, and
   wherein a number of times the (d-1) and the (d-2) are alternately performed in the (d) is greater than a number of times the (b-1) and the (b-2) are alternately performed in the (b).

2. The method of claim 1, wherein a flow rate of the inert gas supplied in the (d-2) is greater than a flow rate of the inert gas supplied in the (b-2).

3. The method of claim 1, wherein a deviation of an inner pressure of the process chamber per unit time in the (d) is greater than a deviation of the inner pressure of the process chamber per unit time in the (b).

4. The method of claim 1, wherein the reactive gas comprises at least one selected from the group consisting of ammonia gas, hydrazine gas and diazene gas.

5. The method of claim 1, wherein the (d-1) and the (d-2) are alternately performed two or more times in the (d), and the (b-1) and the (b-2) are alternately performed once in the (b).

6. A method of manufacturing a semiconductor device, comprising: performing a cycle a predetermined number of times to form a film on a substrate, the cycle comprising non-simultaneously performing:
(a) supplying a source gas to the substrate in a process chamber;
(b) removing the source gas from the process chamber;
(c) supplying a first reactive gas including a hydrogen nitride-based gas to the substrate in the process chamber, the first reactive gas having a chemical structure different from that of the source gas;
(d) removing the first reactive gas from the process chamber;
(e) supplying a second reactive gas having a chemical structure different from those of the source gas and the first reactive gas to the substrate in the process chamber; and
(f) removing the second reactive gas from the process chamber,
wherein
the (b) comprises alternately performing:
(b-1) exhausting an inside of the process chamber to depressurize the inside of the process chamber; and
(b-2) purging the inside of the process chamber using an inert gas, wherein the (d) comprises alternately performing:
(d-1) exhausting the inside of the process chamber to depressurize the inside of the process chamber; and
(d-2) purging the inside of the process chamber using the inert gas,
wherein the (f) comprises alternately performing:
(f-1) exhausting the inside of the process chamber to depressurize the inside of the process chamber; and
(f-2) purging the inside of the process chamber using the inert gas, and wherein
(i) a number of times the (d-1) and the (d-2) are alternately performed in the (d) is greater than a number of times the (b-1) and the (b-2) are alternately performed in the (b), and
(ii) the number of times the (d-1) and the (d-2) are alternately performed in the (d) is greater than a number of times the (f-1) and the (f-2) are alternately performed in the (f).

7. The method of claim 6, wherein a flow rate of the inert gas in the (d-2) is greater than each flow rate of the inert gas in the (b-2) and the (f-2).

8. The method of claim 6, wherein a deviation of an inner pressure of the process chamber per unit time in the (d) is greater than deviations of the inner pressure of the process chamber per unit time in the (b) and the (f).

9. The method of claim 6, wherein the (d-1) and the (d-2) are alternately performed two or more times in the (d),
the (b-1) and the (b-2) are alternately performed once in the (b), and
the (f-1) and the (f-2) are alternately performed once in the (f).

10. The method of claim 6, wherein the first reactive gas comprises at least one selected from the group consisting of ammonia gas, hydrazine gas and diazene gas, and
the second reactive gas comprises at least one selected from the group consisting of oxygen-containing gas, carbon-containing gas and boron-containing gas.

11. A method of manufacturing a semiconductor device, comprising: performing a cycle a predetermined number of times to form a film on a substrate, the cycle comprising non-simultaneously performing:
(a) supplying a source gas to the substrate in the process chamber;
(b) removing the source gas from the process chamber;
(c) supplying to the substrate in the process chamber:
a first reactive gas including a hydrogen nitride-based gas, the first reactive gas having a chemical structure different from that of the source gas; and
a second reactive gas having a chemical structure different from those of the source gas and the first reactive gas; and
(d) removing the first reactive gas and the second reactive gas from the process chamber,
wherein the (b) comprises alternately performing:
(b-1) exhausting an inside of the process chamber to depressurize the inside of the process chamber; and
(b-2) purging the inside of the process chamber using an inert gas, wherein the (d) comprises alternately performing:
(d-1) exhausting the inside of the process chamber to depressurize the inside of the process chamber; and
(d-2) purging the inside of the process chamber using the inert gas, and
wherein a number of times the (d-1) and the (d-2) are alternately performed in the (d) is greater than a number of times the (b-1) and the (b-2) are alternately performed in the (b).

12. The method of claim 11, wherein a flow rate of the inert gas in the (d-2) is greater than a flow rate of the inert gas in the (b-2).

13. The method of claim 11, wherein a deviation of an inner pressure of the process chamber per unit time in the (d) is greater than a deviation of the inner pressure of the process chamber per unit time in the (b).

14. The method of claim 11, wherein the (d-1) and the (d-2) are alternately performed two or more times in the (d), and
the (b-1) and the (b-2) are alternately performed once in the (b).

15. The method of claim 11, wherein the first reactive gas comprises at least one selected from the group consisting of ammonia gas, hydrazine gas and diazene gas, and
the second reactive gas comprises at least one selected from the group consisting of oxygen-containing gas, carbon-containing gas and boron-containing gas.

* * * * *